(12) United States Patent
Yip

(10) Patent No.: US 11,901,446 B2
(45) Date of Patent: Feb. 13, 2024

(54) SIC MOSFET WITH TRANSVERSE P+ REGION

(71) Applicant: Unity Power Technology Limited, Kowloon (HK)

(72) Inventor: Kuk Fong Yip, Sheung Shui (HK)

(73) Assignee: Unity Power Technology Limited, Kowloon (HK)

( * ) Notice: Subject to any disclaimer, the term of this patent is extended or adjusted under 35 U.S.C. 154(b) by 338 days.

(21) Appl. No.: 17/405,114

(22) Filed: Aug. 18, 2021

(65) Prior Publication Data
US 2023/0053874 A1 Feb. 23, 2023

(51) Int. Cl.
*H01L 29/78* (2006.01)
*H01L 29/06* (2006.01)
(Continued)

(52) U.S. Cl.
CPC ...... *H01L 29/7805* (2013.01); *H01L 29/0696* (2013.01); *H01L 29/66068* (2013.01);
(Continued)

(58) Field of Classification Search
CPC ......... H01L 29/1608; H01L 29/66053–66068; H01L 29/7803–7808; H01L 21/02529; H01L 21/02378; H01L 21/02447
See application file for complete search history.

(56) References Cited

U.S. PATENT DOCUMENTS

| 4,837,606 A | 6/1989 | Goodman et al. |
| 10,157,979 B2 | 12/2018 | Ward et al. |

(Continued)

*Primary Examiner* — Eric A. Ward
(74) *Attorney, Agent, or Firm* — Warner Norcross + Judd LLP

(57) ABSTRACT

A silicon carbide MOSFET device that includes a silicon carbide substrate of a first dopant type; a first silicon carbide layer of the first dopant type on top of the silicon carbide substrate; a second silicon carbide layer of a second dopant type embedded in a top portion of the first silicon carbide layer; a third silicon carbide layer of the first dopant type embedded in a top portion of the second silicon carbide layer; a gate oxide layer overlapped to the first silicon carbide layer, the second silicon carbide layer and the third silicon carbide layer; and a fourth silicon carbide layer at least partially overlapping with the second silicon carbide layer along a direction normal to the silicon carbide substrate. The first silicon carbide layer has lower doping than the silicon carbide substrate and defines a drift region. The third silicon carbide layer has higher doping than the first silicon carbide layer. The third silicon carbide layer includes a plurality of third portions that run substantially along a first direction. The second silicon carbide layer includes a plurality of second portions that run substantially along the first direction. The fourth silicon carbide layer includes a plurality of fourth portions that run substantially along a second direction perpendicular to the first direction. The first and second directions each is parallel to the silicon carbide substrate. The transversely arranged P+ regions to N+ regions in some embodiments allow adequate P+ area to achieve good body diode performance and protection to the gate oxide, but without consuming significant area of the MOSFET cell.

20 Claims, 19 Drawing Sheets

(51) Int. Cl.
    *H01L 29/66*     (2006.01)
    *H01L 21/265*    (2006.01)
    *H01L 29/16*     (2006.01)
    *H01L 29/45*     (2006.01)

(52) U.S. Cl.
    CPC .... *H01L 21/26513* (2013.01); *H01L 29/1608* (2013.01); *H01L 29/45* (2013.01)

(56) References Cited

U.S. PATENT DOCUMENTS

2016/0343823 A1* 11/2016 Akram ............... H01L 29/1608
2017/0271467 A1*  9/2017 Kono ................. H01L 21/0485
2018/0182885 A1*  6/2018 Kobayashi .......... H01L 29/1095
2021/0296447 A1*  9/2021 Kyogoku ............ H01L 29/1095

* cited by examiner

SIC MOSFET WITH TRANSVERSE P+ REGION

FIELD OF INVENTION

This invention relates to semiconductor devices, and in particular to silicon carbide MOSFETs.

BACKGROUND OF INVENTION

Silicon Carbide (SiC) Metal-Oxide-Semiconductor Field-Effect Transistors (MOSFET) have been widely used in green energy applications such as electric vehicle, solar power, wind power, and traction control. All these applications are in harsh environments and require the SiC MOSFET to be extremely rugged and reliable. One of the well-known weaknesses of SiC MOSFET is however the gate oxide which is exposed to high electric field during the high temperature reverse bias of the device. Specific reliability tests, such as High Temperature Gate Bias (HTGB) and High Temperature Reverse Bias (HTRB), have been designed to burn-in the devices to ensure the MOSFETs survive under the temperature (say 175 C) and voltage bias (say 1,200V) for a long time (say 1,000 hrs). A lot of SiC MOSFETs failed these reliability tests, especially the HTRB, and the weakness is always the gate oxide above the JFET region of the MOSFET.

There have been attempts made in conventional art to increase robustness of SiC MOSFET in high temperature and/or high voltage bias environment. The fundamental working principle of MOSFETs lies in that, either SiC-MOSFETs or Si-MOSFET; either planar or trench structure, have intrinsic body diode formed by the P+ and the n-drift epi layer. The body diode characteristics affect the overall MOSFET device quality. Forward characteristics and reverse recovery characteristics of the body diode play important role to power MOSFET application such as power supplies, DC-to-DC converters, low-voltage motor controllers, and many other applications. Therefore, a traditional way to enhance the robustness of SiC MOSFET is to increase the width of P+ region and/or reduce the space between two adjacent P+ regions as much as possible. A resultant SiC MOSFET in this way may allow adequate P+ area to achieve good body diode performance and protection to the gate oxide. However, the tradeoff is either increasing the MOSFET cell pitch and consuming significant area of the MOSFET cell, or increasing JFET resistance and degrading the MOSFET performance.

SUMMARY OF INVENTION

In the light of the foregoing background, it is an object of the present invention to focuses on the above-mentioned weakness and propose alternative SiC MOSFET to provide better protection to the gate oxide of these devices.

The above object is met by the combination of features of the main claim; the sub-claims disclose further advantageous embodiments of the invention.

One skilled in the art will derive from the following description other objects of the invention. Therefore, the foregoing statements of object are not exhaustive and serve merely to illustrate some of the many objects of the present invention.

Accordingly, the present invention, in one aspect is a silicon carbide MOSFET device that includes a silicon carbide substrate of a first dopant type; a first silicon carbide layer of the first dopant type on top of the silicon carbide substrate; a second silicon carbide layer of a second dopant type, embedded in a top portion of the first silicon carbide layer; a third silicon carbide layer of the first dopant type, embedded in a top portion of the second silicon carbide layer; a fourth silicon carbide layer at least partially overlapping with the second silicon carbide layer along a direction normal to the silicon carbide substrate; a gate oxide layer overlapped to the first silicon carbide layer, the second silicon carbide layer and the third silicon carbide layer; and a polysilicon layer in touch with gate oxide, serving as gate material of the silicon carbide MOSFET. The first silicon carbide layer, which is formed by epitaxy process, has lower doping than the silicon carbide substrate and defines a drift region. The third silicon carbide layer, which is formed by ion implantation process, has higher doping than the first silicon carbide layer. This third silicon carbide layer includes a plurality of third portions that run substantially along a first direction. The second silicon carbide layer, which is formed by ion implantation process, includes a plurality of second portions that run substantially along the first direction. The fourth silicon carbide layers, which is formed by ion implantation process, has higher doping than the second silicon carbide layer. This fourth silicon carbide layer includes a plurality of fourth portions that run substantially along a second direction perpendicular to the first direction. The first and second directions each is parallel to the silicon carbide substrate.

In some embodiments, the first dopant type is N and the second dopant type is P.

The third silicon carbide layer is an N+ layer, and the third portions of the third silicon carbide layer are separated from each other along the second direction. The fourth silicon carbide layer is a P+ layer, and the fourth portions are P+ portions which are separated from each other along the first direction.

In some embodiments, the second silicon carbide layer contains a plurality of P-well regions separated from each other along the second direction.

In some embodiments, a depth of the fourth silicon carbide layer is equal to or smaller than a depth of the second silicon carbide layer.

In some embodiments, a spacing between the fourth portions of the fourth silicon carbide layer is equal to or smaller than a spacing of the P-well regions of the second silicon carbide layer.

In some embodiments, a depth of the fourth silicon carbide layer is greater than a depth of the second silicon carbide layer.

In some embodiments, a spacing between the fourth portions of the fourth silicon carbide layer is greater than a spacing of the P-well regions of the second silicon carbide layer.

In some embodiments, the plurality of P-wells is doped using multiple consecutive ion implantations with gradually lower energy and lower dose.

In some embodiments, the third silicon carbide layer contains two N+ regions as the third portions which are disposed respectively on two opposite sides of the gate oxide layer.

In some embodiments, the second silicon carbide layer contains a P-base. The device further contains a plurality of trenches.

In some embodiments, a depth of the fourth silicon carbide layer is greater than a depth of the plurality of trenches.

In some embodiments, the third silicon carbide layer contains a P+ region sandwiched between two N+ regions on each of two opposite sides of the gate oxide layer.

In some embodiments, the third silicon carbide layer contains two N+ regions as the third portions which are disposed respectively on two opposite sides of the gate oxide layer.

In some embodiments, the gate oxide layer contains a plurality of oxide portions each formed along the sidewall direction in one of the plurality of trenches.

In some embodiments, the P+ portions are doped using multiple consecutive ion implantations with a double-peak profile.

In some embodiments, a width of the fourth silicon carbide layer along the first direction is a minimum width that a fabrication process of the device can achieve.

In some embodiments, each of the fourth portions is in a strip, bamboo, I-beam or dumbbell shape when viewed from a direction perpendicular to the silicon carbide substrate.

In another aspect of the invention, a method of producing a silicon carbide MOSFET device is provided, which contains the steps of providing a first silicon carbide layer comprising first epitaxy layer and second epitaxy layer of a first dopant type on top of a silicon carbide substrate; providing a second silicon carbide layer of a second dopant type, embedded in a top portion of the first silicon carbide layer; providing a third silicon carbide layer of the first dopant type, embedded in a top portion of the first silicon carbide layer; providing a fourth silicon carbide layer at least partially overlapping with the second silicon carbide layer along a direction normal to the silicon carbide substrate; providing a gate oxide layer overlapped to the first silicon carbide layer, the second silicon carbide layer and the third silicon carbide layer; and providing a polysilicon layer in touch with gate oxide, serving as gate material of the silicon carbide MOSFET. The fourth silicon carbide layer contains a plurality of fourth portions that run substantially along a second direction perpendicular to the first direction. The first and second directions each is parallel to the silicon carbide substrate. The first silicon carbide layer has lower doping than the silicon carbide substrate, and the third silicon carbide layer has higher doping than the first silicon carbide layer. The third silicon carbide layer contains a plurality of third portions that run substantially along a first direction.

In some embodiments, the first dopant type is N and the second dopant type is P. The third silicon carbide layer is an N+ layer, and the third portions of the third silicon carbide layer are separated from each other along the second direction. The fourth silicon carbide layer is a P+ layer, and the fourth portions are P+ portions which are separated from each other along the first direction.

In some embodiments, the method further includes the steps of doping the P+ portions using multiple consecutive ion implantations with a double-peak profile.

In some embodiments, the method further includes the steps of implanting a first series of dopants on a first epitaxy layer, and implanting a second series of dopants on a second epitaxy layer which is deposited on top of the first epitaxy layer. The second series of dopants join the first series of dopants along a depth direction of the fourth silicon carbide layer.

Embodiments of the invention therefore achieve SiC MOSFET structures with increased ruggedness of the MOSFET device, but without compromising the relatively small area of the MOSFET cell that is used. For instance, for vertical planar MOSFET, the transversely arranged P+ regions to N+ regions in some embodiments allow adequate P+ area to protect the gate oxide, but without consuming significant area of the MOSFET cell. At the same time, the MOSFET device meets the channel mobility and threshold voltage target by carefully choosing the P-Well profile which is critical for the MOSFET channel and junction-gate field-effect transistor (JFET) effect. On another hand, some embodiments provide a trenched SiC MOSFET in which the same idea of P+ region perpendicular to N+ regions is applied. The P+ region acts as a shield to allow the gate oxide near the bottom of the trench to be protected. The P+ region connects to the source contact directly so the body diode performance can be much improved.

BRIEF DESCRIPTION OF FIGURES

The foregoing and further features of the present invention will be apparent from the following description of preferred embodiments which are provided by way of example only in connection with the accompanying figures, of which:

FIG. 5b illustrates the doping junction profile of P+ region in the MOSFET device corresponding to FIG. 5a.

FIG. 7 shows a flowchart of the major steps in manufacturing the MOSFET device in FIG. 1 or FIG. 5a.

In the drawings, like numerals indicate like parts throughout the several embodiments described herein.

DETAILED DESCRIPTION OF THE PREFERRED EMBODIMENTS

In the claims which follow and in the preceding description of the invention, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the invention.

As used herein and in the claims, "couple" or "connect" refers to electrical coupling or connection either directly or indirectly via one or more electrical means unless otherwise stated.

Terms such as "horizontal", "vertical", "upwards", "downwards", "above", "below" and similar terms as used herein are for the purpose of describing the invention in its normal in-use orientation and are not intended to limit the invention to any particular orientation.

When describing the silicon carbide structures of any MOSFET device the terms "region" and "portion" are used interchangeably since a region in the MOSFET device that is made of a particular material different that of its surrounding part could also be said to be a portion of made of the particular material.

Figure 1:
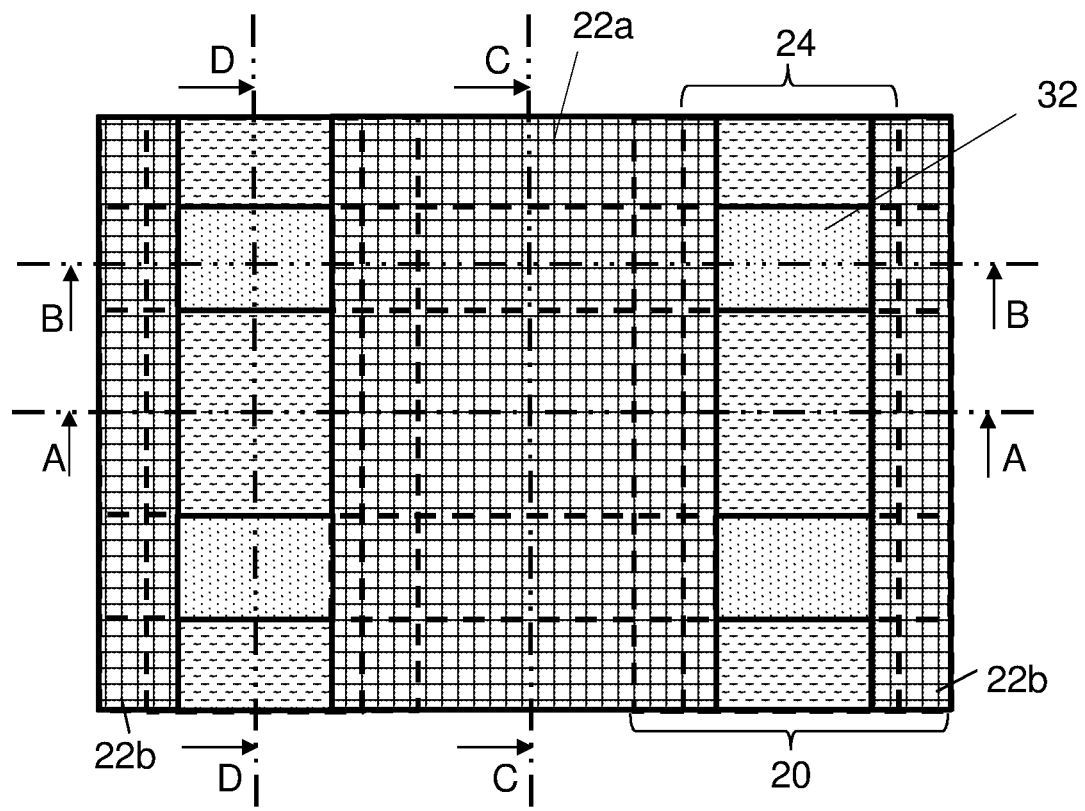
FIG. 1 shows the active cell layout of a vertical planar MOSFET device according to a first embodiment of the invention.
Figure 2A:
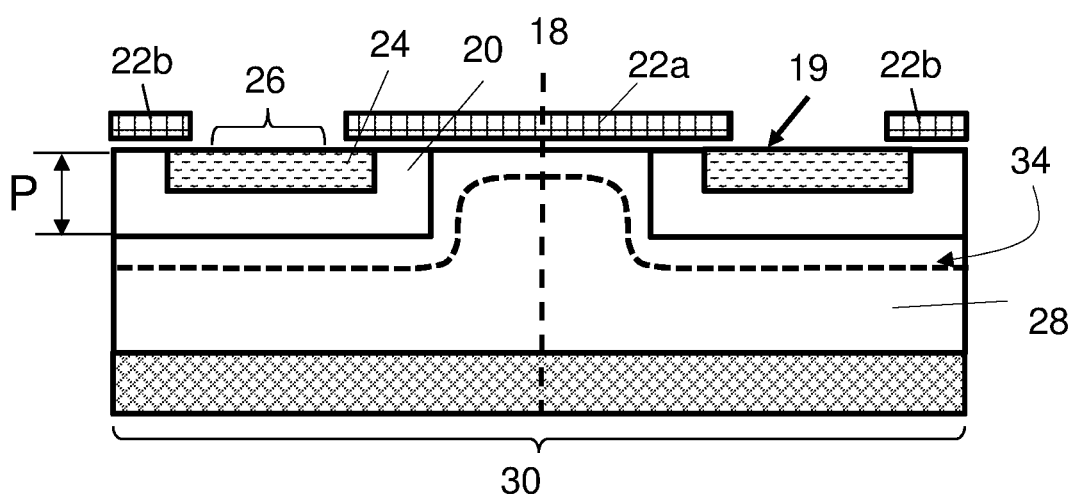
FIGS. 2a-2d are cross-sectional views of the MOSFET device in FIG. 1 respectively along lines A-A, B-B, C-C and D-D.
Figure 2B:
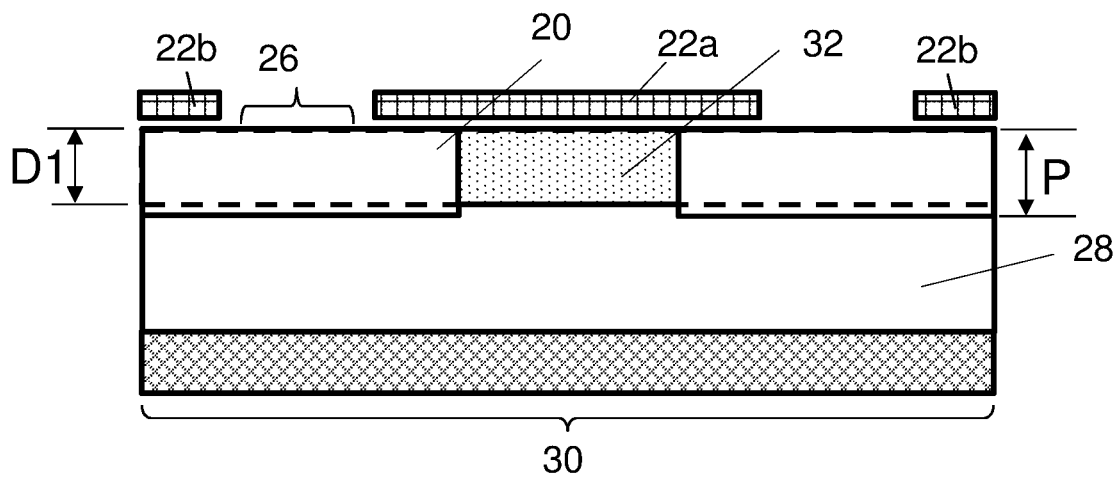
Figure 2C:
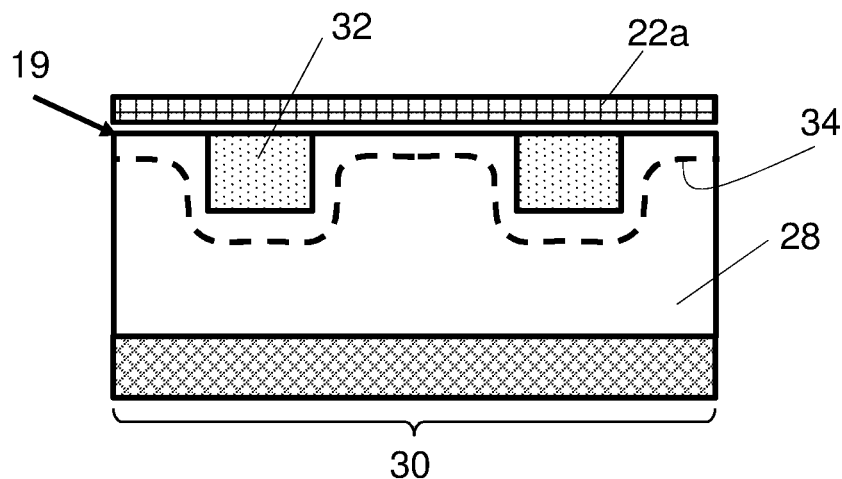
Figure 2D:
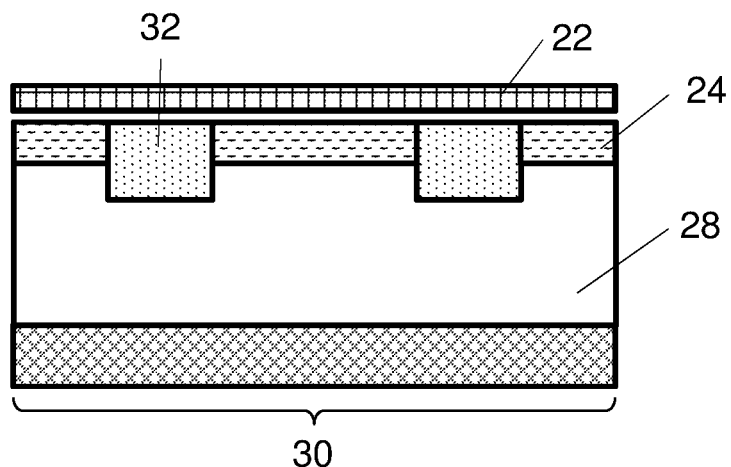

Referring now to FIGS. 1-2d, the first embodiment of the present invention is a vertical planar MOSFET device, which is shown in FIG. 1 in an active cell layout (i.e. a fully functional MOSFET can be formed by extending this active cell to desirable dimension, then surrounded by edge termination). The MOSFET device arranges a source, a gate, and a drain, which make up the silicon pillar vertically (as shown in FIGS. 2a-2d). In particular, a silicon carbide substrate 30 is configured as the underlying structure and epitaxy of the MOSFET device in FIG. 1. As skilled persons would understand the silicon carbide substrate 30 is made from SiC wafers, and in this embodiment the silicon carbide substrate 30 is of N+ type as a first dopant type. There is also a metal layer (not shown) formed at the bottom side of the silicon carbide substrate 30 as an ohmic contact to be used as the drain contact of the MOSFET device. On top of the silicon carbide substrate 30, there is a first silicon carbide layer 28 of N− type, and the first silicon carbide layer 28 functions as an N− drift layer. The first silicon carbide layer 28 has lower doping than the silicon carbide substrate 30 and they are respectively designated using N− and N+. As one can see in FIGS. 2a and 2c, in some part of the MOSFET device the first silicon carbide layer 28 extends upward all the way to the top surface 19 of the SiC structure of the MOSFET device.

Near the top surface 19, there are multiple P-well portions 20 configured that together form a second silicon carbide layer of the MOSFET device. This second silicon carbide layer has a second dopant type P as compared to the first dopant type N of the first silicon carbide layer 28 and the silicon carbide substrate 30. The P-well portions 20 in this embodiment are embedded in a top portion of the first silicon carbide layer 28. As shown in FIG. 2a, there are two P-well portions 20 and these two P-well portions 20 are symmetrically located with respect to a central virtual plane 18 that is perpendicular to the silicon carbide substrate 30 and corresponds to Line C-C in FIG. 1. The plurality of P-well portions 20 are therefore separated from each other along a direction normal to the virtual plane 18. Each P-Well portion 20 is further symmetrical about and encloses an N+ portion 24 that is also embedded in a top portion of the first silicon carbide layer (and the top portion of the entire SiC structure). As shown in FIGS. 1 and 2a there are two N+ portions 24 each of which has a strip shape, and the N+ portions 24 together form a third silicon carbide layer of the MOSFET device. The N+ portions 24 have higher doping than the first silicon carbide layer 28 while they are all of the same N dopant type.

The N+ portions 24 and the P-well portions 20 all extend parallel to both the silicon carbide substrate 30 and the virtual plane 18. The two N+ portions 24 are also symmetrical about the virtual plane 18. As best shown in FIG. 2a, the N+ portions 24, the P-well portions 20, and the first silicon carbide layer 28 (with regards to its tallest portions) all have their top faces flush with the top surface 19 of the SiC structure of the MOSFET device. In this way it can be said that the N+ portions 24 and the P-well portions 20 are embedded at a top portion of the first silicon carbide layer 28 (and the top portion of the SiC structure). The portion of the first silicon carbide layer 28 between the two P-well portions 20 that are closest to the virtual plane 18 constitutes a Junction FET (JFET) region.

Above the top surface 19 of the SiC structure of the MOSFET device there is a stack of a gate oxide layer, which is a dielectric layer and a polysilicon layer, which is a conductive layer to form the gate. The gate oxide layer (not shown) is located directly underneath the polysilicon layer and overlapped to first silicon carbide layer 28, the second silicon carbide layer and the third silicon carbide layer. A gate terminal is on top of source and drain terminals (the terminals not shown) as well as the conductive channel that connects the source and the drain when the MOSFET device is turned on. As shown in FIG. 1-2b there are three gate portions that form the gate terminal, including two partial gate portions 22b, and a full gate portion 22a which the virtual plane 18 intersects at its center is placed on top of the JFET region, and covers partially the N+ portions 24 as well as the two adjacent P-well portions 20. The partial gate portions 22b and the full gate portion 22a are part of the polysilicon layer. The two partial gate portions 22b are parts of the gate and will form full gate portions 22a when they extend along the direction normal to the virtual plane 18. In fact, it should be noted that the layout shown in FIG. 1-2d is just a portion a wafer (but the portion is larger than one unit cell). The structure of more than one unit cell is shown in FIGS. 1-2d to indicate how the unit cells are integrated on a single wafer. Those skilled persons will understand how to obtain same (repeating) structures like the unit cell shown in FIGS. 1-2d by extending the partial cell (e.g. the partial gate portions 22b being part of a partial cell) at the each edge. All three gate portions 22a, 22b as can be seen in FIG. 1 run parallel to the direction that the virtual plane 18 extends.

The regions (portions) that extend parallel to the virtual plane 18 in the SiC structure of the MOSFET device in FIG. 1 have been described above, but there are other portions that extend in a direction normal to the virtual plane 18 and parallel to the silicon carbide substrate 30. In particular, as seen in FIG. 1 and FIG. 2b there are two P+ portions 32 which act as both body diode contacts as well as P+ sinker, and the P+ portions 32 run perpendicularly to the N+ portions 24 and the P-Well portions 20. As shown in FIG. 2b, the junction depth of P+ portions 32 is slightly smaller than that of the P-well portions 20 although in other embodiments they can be equal or deeper. As best shown in FIG. 1, the P+ portions 32 overlap with the P-well portions 20, the N+ portions 24 and part of the first silicon carbide layer 28 (as the N− drift layer) along the vertical direction in FIGS. 2a-2d. The multiple P+ portions 32 together form a fourth silicon carbide layer of the MOSFET device.

It should be noted that in FIGS. 1-2d, the metal terminals of the MOSFET device are not shown, which as skilled persons would understand, are formed by conductive materials deposited over the gate portions 22a and 22b, the underside of the silicon carbide substrate 30, and source regions 26 formed by the N+ portions 24 to form respectively the gate terminal, the drain terminal and the source terminal. Examples of such conductive materials include Titanium (Ti), Nickel (Ni), Titanium nitride (TiN), Titanium aluminum (TiAl), Platinum (Pt), Aluminum (Al) and the like.

Figure 3:
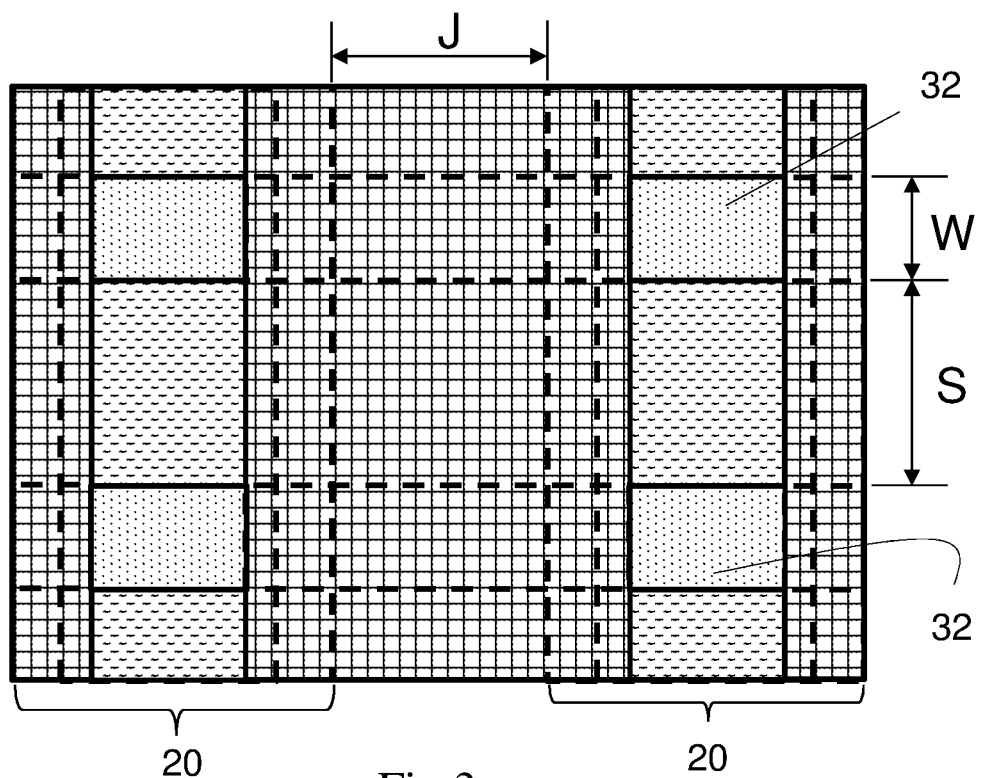
FIG. 3 shows the definitions of certain dimensions in the MOSFET device of FIG. 1.

Turning now to FIG. 3, with reference to which some dimensions of the various regions in the MOSFET device of FIG. 1 are now explained. The two P+ portions 32 as mentioned above extend in a direction perpendicular to those of the gate portion 22a, the P-well portions 20 and the N+ portions 24. Each P+ portion 32 has a width W as shown in FIG. 3, and the spacing between the two P+ portions 32 is S. The width W of each P+ portion 32 should be the minimum dimension the MOSFET device manufacturing process can produce, which is limited by the photolithography resolution and etching process to open the window for P+ doping by ion implantation. In this embodiment, the width W is 1 μm. The spacing S between the two P+ portions 32 depends on two parameters, namely a junction depth D1 (see FIG. 2b) of the P+ portions 32 and a P-well space J (see FIG. 3). In order to obtain the optimal performance of the MOSFET device, the overlapping (pitching) of depletion region 34 of the JFET region (see FIGS. 2a and 2c), in parallel to MOSFET channel caused by the P-well portions 20 should happen at the same time as in perpendicular to MOSFET channel caused by the P+ portions 32. In this embodiment, since the junction depth D1 of the P+ portions 32 is equal or smaller than a junction depth P (see FIG. 2a) of the P-well portions 20, the spacing S between the two P+ portions 32 should be equal or smaller than the P-well space J. In one specific implementation of the MOSFET device in FIGS. 1-3, the junction depth P of the P-well portions 20 is 1.5 μm, and the P-Well space J is 1.8 μm. The corresponding junction depth D of the P+ portions 32 is 1.2 μm and the spacing S between the two P+ portions 32 is 1.45p m.

In another specific implementation of the MOSFET device in FIGS. 1-3, the silicon carbide substrate 30 is a N+ doped 4H-SiC, 3C-SiC, or 6H-SiC semiconductor layer, with thickness around 350 μm and resistivity from 0.02 Ω·cm to 0.03 Ω·cm. The first silicon carbide layer 28 is an N− epitaxial layer with a thickness in the range of 4 μm to 35 μm, and a doping concentration in the range of 1e15 cm$^3$ to 3e16 cm$^3$. The P-well portions 20 contains aluminium dopant, with a junction depth in the range of 1 μm to 1.75 μm. The surface doping concentration of the P-well portions 20 is in the range of 1e17 cm$^{-3}$ to 5e18 cm$^{-3}$, and its peak doping is in the range of 1e18 cm$^3$ to 5e18 cm$^3$. The P+ portions 32 contains aluminium dopant, with a doping concentration in the range of 5e19 cm$^3$ to 2e20 cm$^{-3}$, and a peak doping near the top surface being 2e20 cm$^{-3}$. Whereas, the peak doping near the bottom of the P+ portions 32 is 8e19 cm$^3$. The N+ portions 24 contains nitrogen or phosphorus dopant, with a junction depth in the range of 0.2 μm to 0.5 μm, and a doping concentration in the range of 1e20 cm$^3$ to 1.5e20 cm$^3$. The gate portions 22a and 22b is a stack of silicon dioxide with a thickness in the range of 20 nm to 70 nm underneath a gate polysilicon with in-situ doping, and thickness in the range of 400 nm to 800 nm.

Figure 4A:
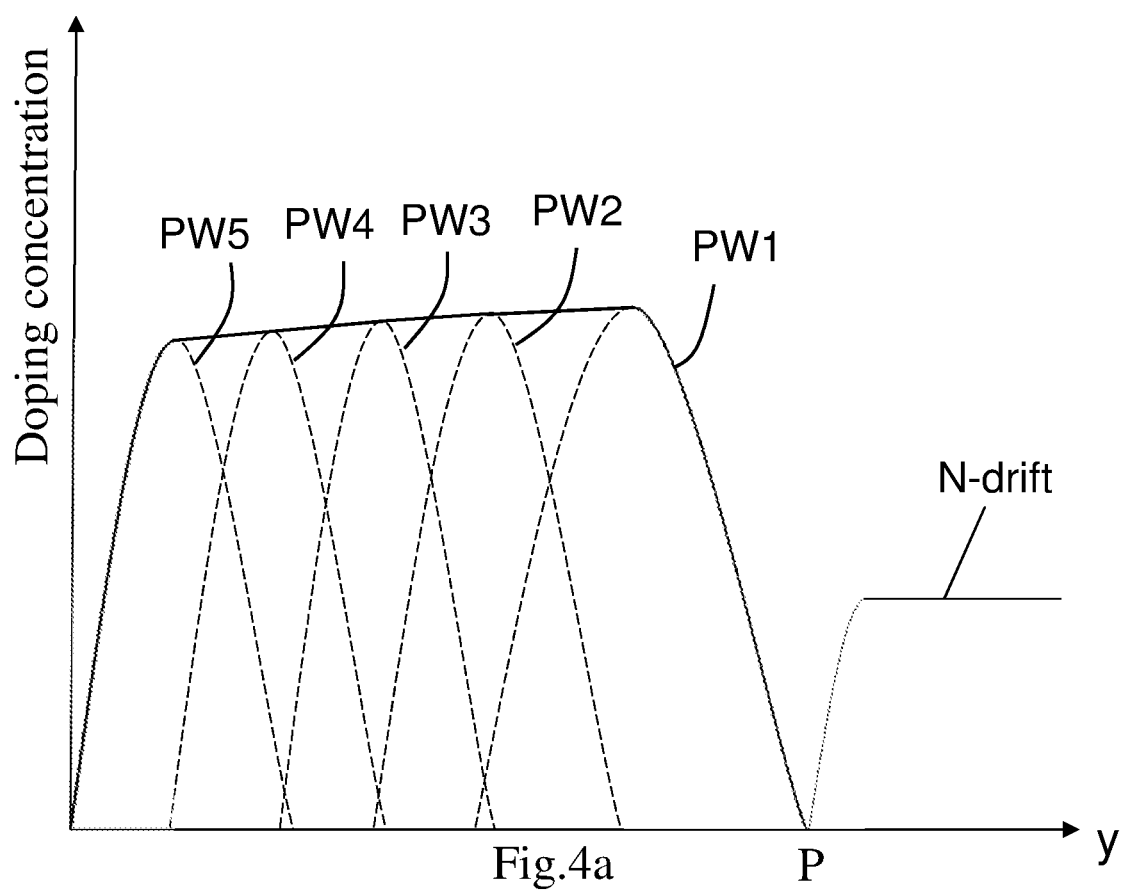
FIG. 4a illustrates the doping junction profile of P-Well in the MOSFET device in FIG. 1.

Next, the doping profiles of the P-well portions 20 and the P+ portions 32 in the MOSFET device in FIGS. 1-3 will be described with reference to FIGS. 4a-4b. The profile for the P-well portions 20 is critical for the MOSFET channel and JFET effect of the MOSFET device. The doping concentration at the surface of the P-well portions 20 (i.e. near the top surface 19 in FIG. 2a) forms the MOSFET channel and determine parameters such as threshold voltage and channel mobility. The junction depth P of the P-well portions 20 and doping concentration at bottom of the P-well portions 20 determine the efficiency of body diode and depletion of the JFET region. In this embodiment, the P-well portions 20 are designed to slightly retrograde to fulfil the MOSFET and JFET performance target. To do that, the dopants (such as aluminium ions) are implanted to the first silicon carbide layer 28 by using the patterned hard mask. There are a series of implantation, typical 3 to 6 steps, with different dosage and energy to achieve the required profile. In the specific implementation shown in FIG. 4a, P-well doping consists of five consecutive ions implantation, namely PW1, PW2, PW3, PW4 and PW5. As illustrated, PW1 corresponds to ion implantation with highest energy and highest dose, therefore resulting in the retrograde doping profile. PW2, PW3 and PW4 are ion implantations with gradually lower energy and dose so that each junction profiles are overlapped smoothly. PW5 is an ion implantation in which the energy and dose are adjusted to meet the channel mobility and threshold voltage target.

Figure 4B:
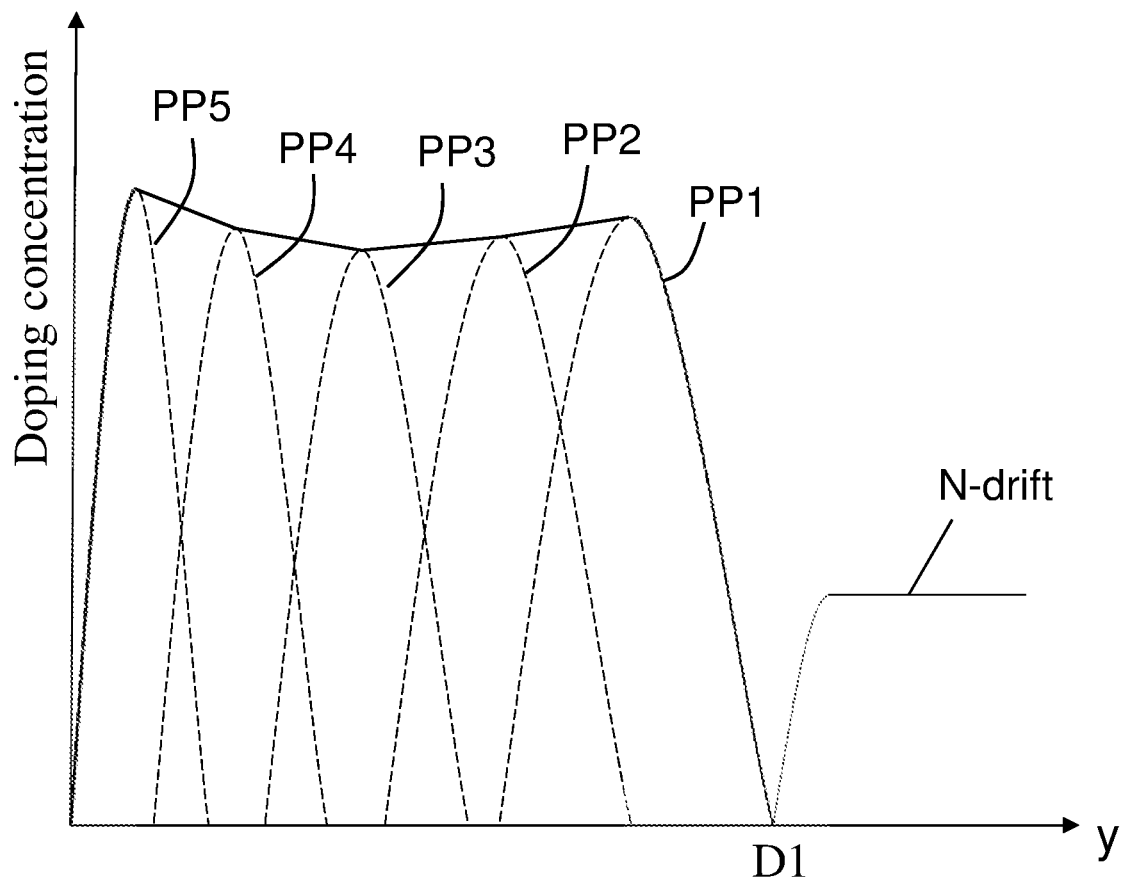
FIG. 4b illustrates the doping junction profile of P+ region in the MOSFET device in FIG. 1.

Turning to FIG. 4b. As mentioned previously in the embodiments of FIGS. 1-3 the junction depth D1 of the P+ portions 32 is designed to be smaller or same as the junction depth P of the P-well portions 20. Smaller junction depth allows the use of the same or thinner hard mask thickness as P-well implantation. It is crucial to keep good control of the critical dimensions (width and space) of the P+ portions 32. As shown in FIG. 4b, the doping of the P+ portions 32 is showing a double-peaks profile. The surface of the P+ portions 32 (i.e. near the top surface 19 in FIG. 2a) is highly doped to form the ohmic contact. The doping concentration at bottom of the P+ portions 32 is also highly doped to boost efficiency of body diode. The dopants (such as aluminium ions) are implanted to the first silicon carbide layer 28 by using the patterned hard mask. There are a series of implantations, typical 3 to 6 steps, with different dosage and energy to achieve the required profile. In the specific implementation shown in FIG. 4b, the P+ region doping consists of five ions implantation, namely PP1, PP2, PP3, PP4 and PP5. As illustrated, PP1 corresponds to the ion implantation with highest energy, and therefore it results in the deepest projection range. PP2 and PP3 are ion implantations with gradually lower energy and dose so that each junction profiles are overlapped smoothly. To achieve the ohmic contact, PP4 and PP5 are ion implantations with doses going higher when the implantation energy go lower.

Figure 5A:
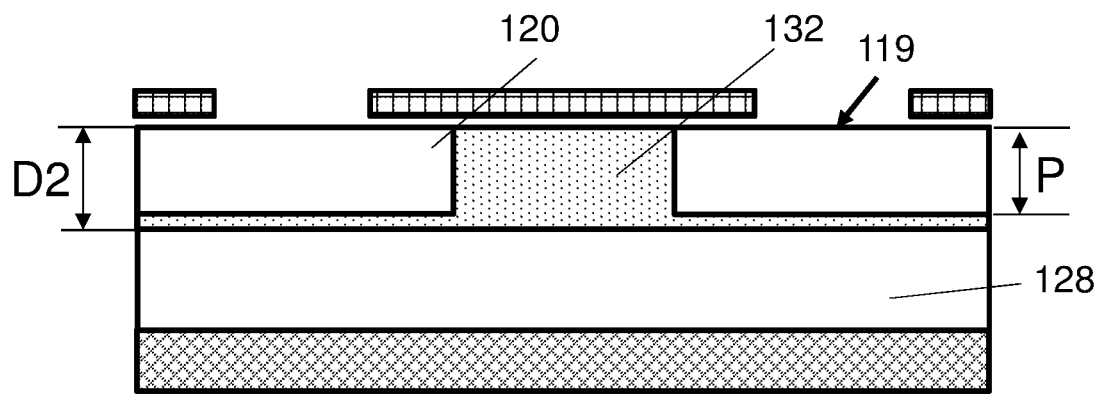
FIG. 5a shows a cross-section of a vertical planar MOSFET device according to a second embodiment of the invention.
Figure 5B:
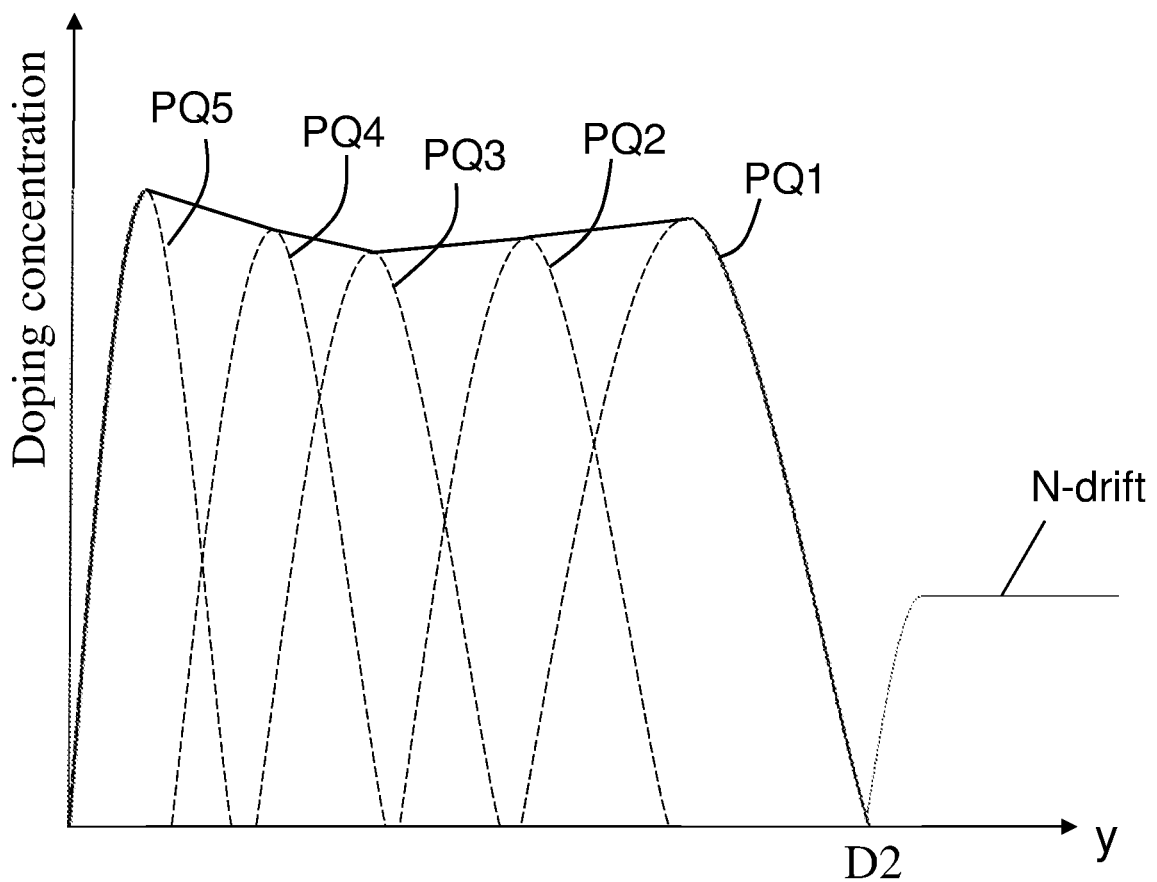

Referring to FIG. 5a-5b, a second embodiment of the invention is now described, which similar to that in FIGS. 1-4b is a SiC MOSFET device. Most of the features of the MOSFET device in FIG. 5a are similar to those of the silicon carbide diode array in FIGS. 1-4b so they will not be described again here for the sake of brevity. Only the difference between the MOSFET devices in FIG. 5a-5b and FIGS. 1-4b will be described herein. In particular, unlike the embodiment in FIGS. 1-4b where the junction depth D1 of the P+ portions is designed to be smaller or same as the junction depth P of the P-well portions, in the embodiment of FIG. 5a-5b the junction depth D2 of P+ portions 132 is extended to pass the junction depth P of the P-well portions 120. In other words, the junction depth D2 of P+ portions 132 is greater than that of the P-well portions 120. At the same time, in this embodiment the spacing S between the P+ portions 132 of the fourth silicon carbide layer is greater than a spacing J of the P-well portions 120 of the second silicon carbide layer (the definitions of S, J and W are the same as those mentioned above). This further improve the body diode performance, and allow the larger P+ portion space to width ratio for higher channel density in the MOSFET cell. In one specific implementation of the MOSFET device in FIG. 5a-5b, the junction depth P of the P-well portions 320 is 1.5 μm, and the P-Well space J is 1.8 μm. The corresponding junction depth D2 of the P+ portions 132 is 1.8 μm and the spacing S between the two P+ portions 132 is 2.16 μm.

Similar to the P+ portions 32, the doping of the P+ portions 132 shown in FIG. 5b also shows a double-peaks profile. The surface of the P+ portions 132 (i.e. near the top surface 119 in FIG. 5a) is highly doped to form the ohmic contact. The doping concentration at bottom of the P+ portions 132 is also highly doped to boost efficiency of body diode. The dopants (such as aluminium ions) are implanted to the first silicon carbide layer 128 by using the patterned hard mask. There are a series of implantations, typical 3 to 6 steps, with different dosage and energy to achieve the required profile. In the specific implementation shown in FIG. 5b, the P+ region doping consists of five ions implantation, namely PQ1, PQ2, PQ3, PQ4 and PQ5. As illustrated, PQ1 corresponds to the ion implantation with highest energy, and therefore it results in the deepest projection range. PQ2 and PQ3 are ion implantations with gradually lower energy and dose so that each junction profiles are overlapped smoothly. To achieve the ohmic contact, PQ4 and PQ5 are ion implantations with doses going higher when the implantation energy go lower.

Figure 6A:
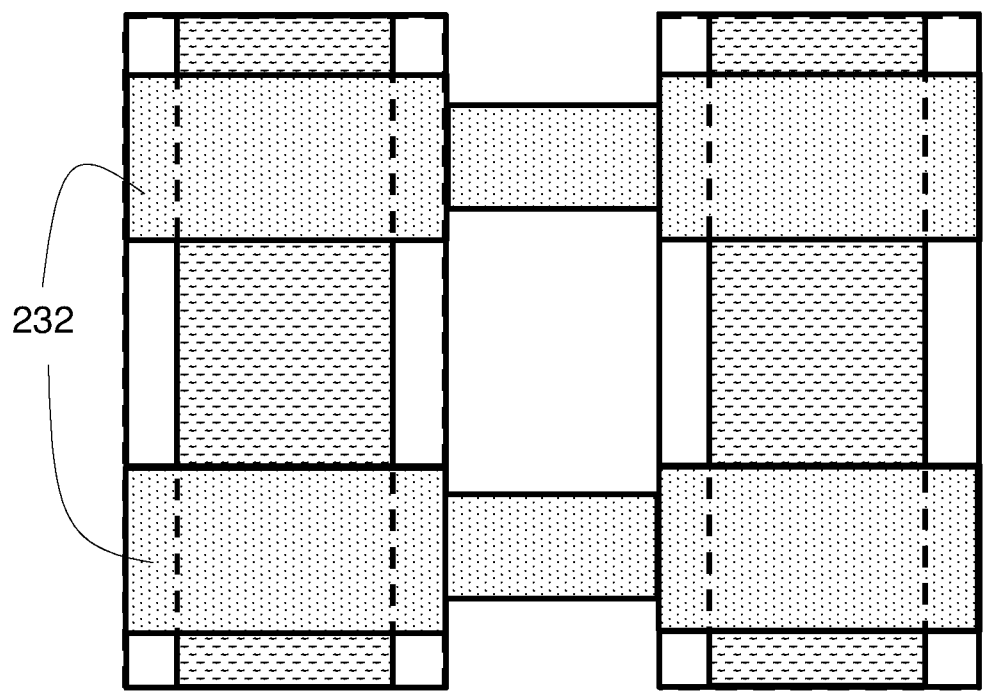
FIGS. 6a-6c illustrate various modifications to the geometry of P+ region in the MOSFET devices in FIGS. 1-5.
Figure 6B:
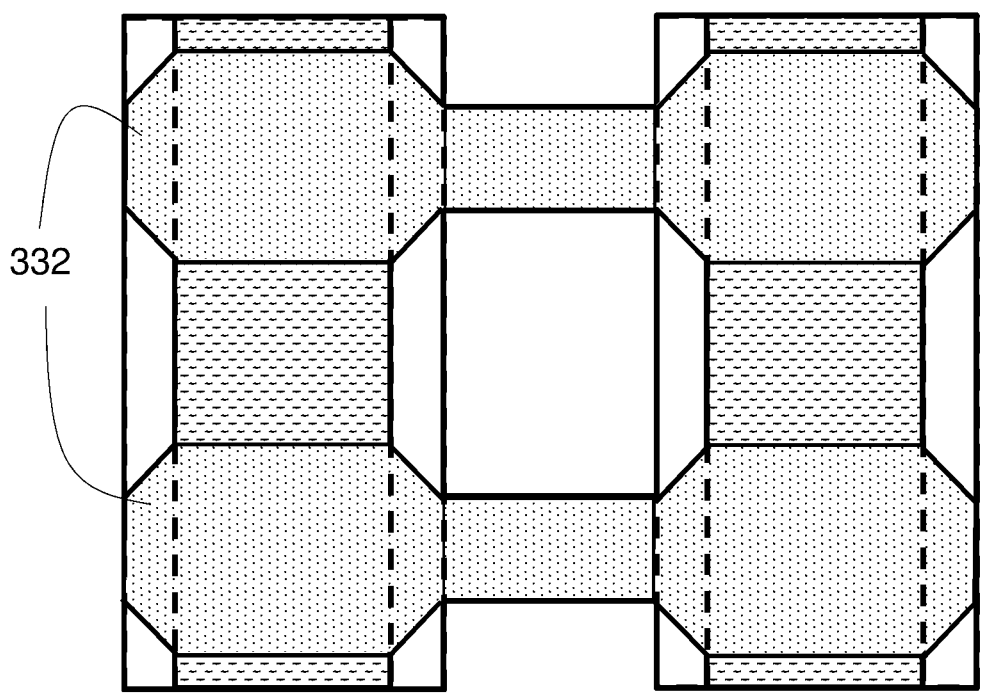
Figure 6C:
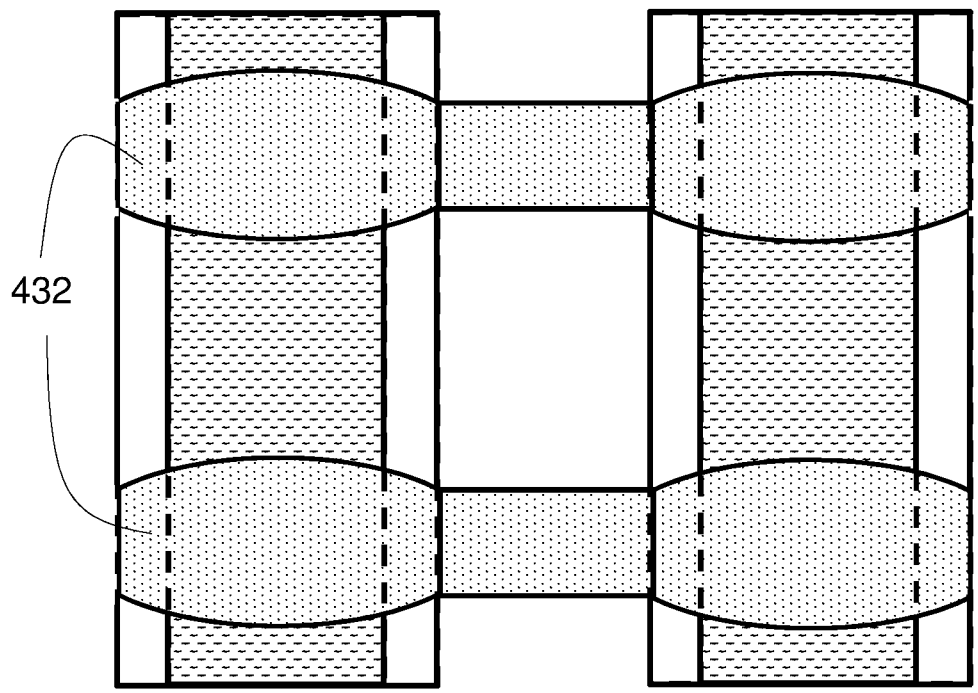

Next, FIGS. 6a-6c show active cell layout variations of the embodiments mentioned above in which the geometry of the P+ portions are changed. For simplification, the gate portions are not shown. The geometry of P+ portions can be changed to balance among parameters such as body diode performance, MOSFET channel density, protection to the gate oxide from electric field. The embodiments in FIGS. 1-5b uses the strip-type P+ portions, but it is not the only possible geometry that can be used. In FIG. 6a, the P+ portions 232 each has an I-beam shape in the top view. In FIG. 6b, the P+ portions 332 each has a dumbbell shape in the top view. In FIG. 6c, the P+ portions 432 each has a bamboo type.

Figure 7:
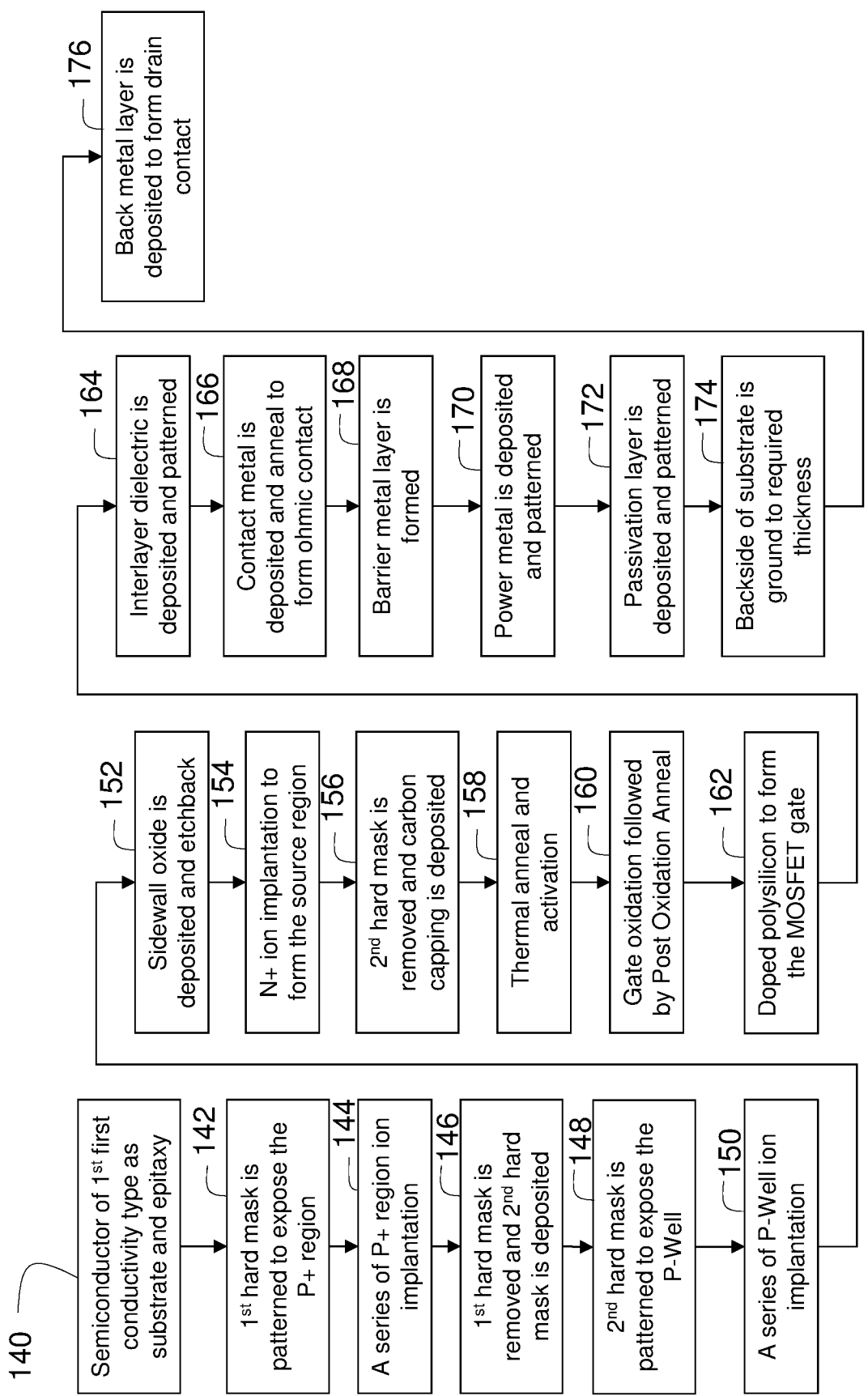

FIG. 7 shows an exemplary method of how to produce the MOSFET devices in FIGS. 1-5b. Note that the exemplary method described in this embodiment is not intended to be limiting, as the same MOSFET device may be produced using other methods, and/or with different sequences of the steps. The method starts at Step 140 in which a raw silicon carbide epi wafer which has been cleaned using the RCA clean procedures is prepared. The wafer comes with a silicon carbide substrate of N+ type and a first silicon carbide layer on top thereof which is of N− type. It should be noted that a whole wafer will be processed to multiple MOSFET devices before the wafer is cut to individual chips of MOSFET devices. As mentioned previously the first silicon carbide layer is an epitaxy N− drift layer less doped than the silicon carbide substrate. Then, in Step 142 a first hard mask (e.g. dielectric mask such as SiO$_2$) is applied to the first silicon carbide layer. The hard mark process for example may be done by Plasma Enhanced Chemical Vapor Deposition (PECVD) by using tetraethylorthosilicate (TEOS) on the wafer, and in particular on the top side of the first silicon carbide layer, so that a layer of oxide is formed on the surface of the wafer. Then, an oxide hard mask layer is patterned (not shown) through conventional lithography such as optical, ion and electron beam lithography, and oxide etching process in order to expose portions of the first silicon carbide layer that are intended to form P+ portions. In Step 144, a series of P+ ion implantations are carried out from the top surface of the first silicon carbide layer in a manner such as those shown in FIG. 4b or FIG. 5b to make the P+ portions. In Step 146, the first hard mask is removed, and the next, second hard mask is deposited on the first silicon carbide layer using the same process as first hard mask. The thickness of second hard mask can be the same or different from the first hard mask. It must be thick enough to absorb the ions at masking sites In Step 148 the second hard mask is patterned to expose portions of the first silicon carbide layer that are intended to form P-well portions. In Step 150, a series of P− ion implantations are carried out such as those shown in FIG. 4a to make the P-well portions in the first silicon carbide layer. In Step 152, sidewall oxide is deposited on the second hard mask as well as the first silicon carbide layer, then etched back to form sidewall oxide portions and expose the N+ portions. In Step 154, N+ ion implantations are conducted at the top surface of the first silicon carbide layer to form N+ portions that are intended to be used as source regions. The N+ ion implantations can counter-dope the P-well portions, but cannot counter-dope the P+ portions. Next, in Step 156 the second hard mask is removed, and carbon capping is deposited on the top surface of the SiC structure. This carbon capping is necessary to minimize surface roughness caused by high temperature anneal process. In Step 158, with the carbon capping ready the whole SiC structure then undergoes thermal anneal and activation. In Step 160, after the top surface of the SiC structure is fully cleaned, the gate oxide is deposited, which is followed by post-oxidation anneal. In Step 162 doped polysilicon is deposited on top of the gate oxide portion to form the MOSFET gate. In Step 164 an interlayer dielectric (ILD) is deposited on top of the entire MOSFET device. The ILD is then patterned by photolithography and etching process on the top face of the portions of the first silicon carbide layer, leaving contacts for the ohmic metal later. In Step 166 a layer of ohmic metal is deposited on the entire MOSFET device, and the ohmic metal fills in the previously mentioned contacts and then undergoes an annealing process. The ohmic contacts of the MOSFET device are thus formed. In Step 168 a barrier metal layer is formed on top of the ohmic metal, and in Step 170 a layer of power metal is deposited and patterned on top of the barrier metal layer. In Step 172 a passivation layer is deposited and patterned on top of the power metal. In Step 174 a backside of the silicon carbide substrate is grounded to a required thickness. Finally, in Step 176 a back metal layer is deposited at the backside of the silicon carbide substrate to form drain contact of the MOSFET device. To this step the manufacturing of the MOSFET device is then completed.

Figure 8:
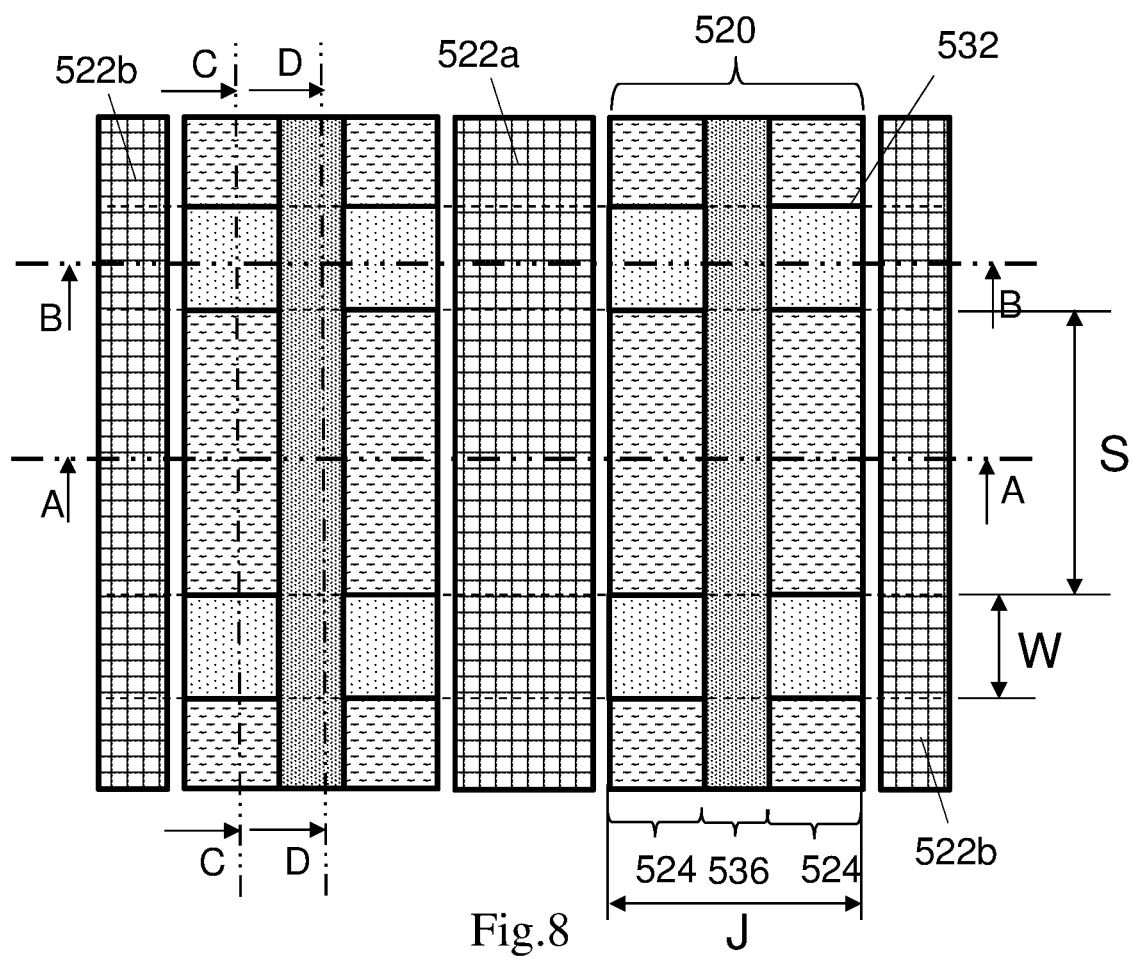
FIG. 8 shows the active cell layout of a trench MOSFET device according to a third embodiment of the invention.
Figure 9A:
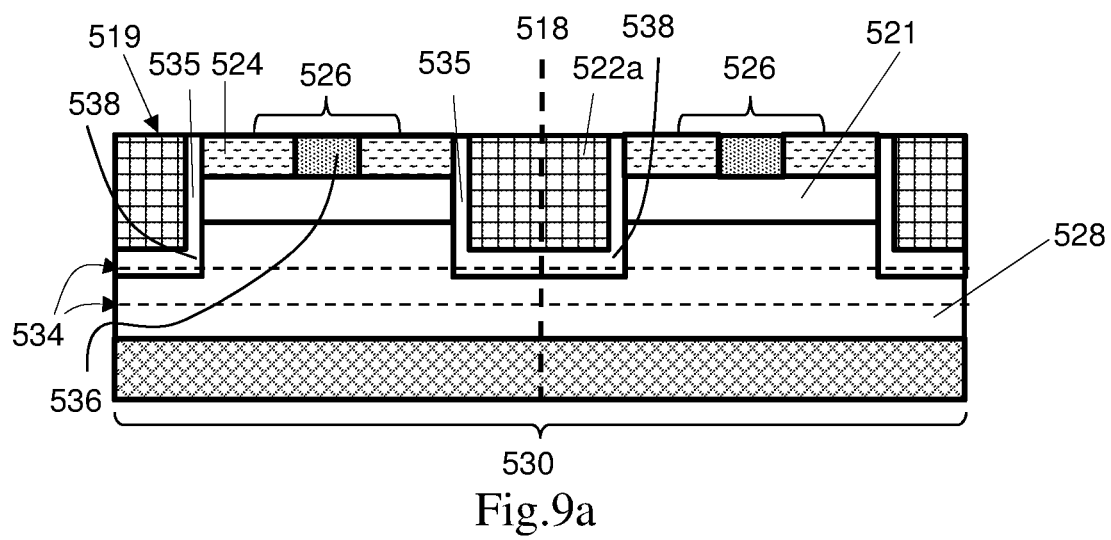
FIGS. 9a-9d are cross-sectional views of the MOSFET device in FIG. 8 respectively along lines A-A, B-B, C-C and D-D.
Figure 9B:
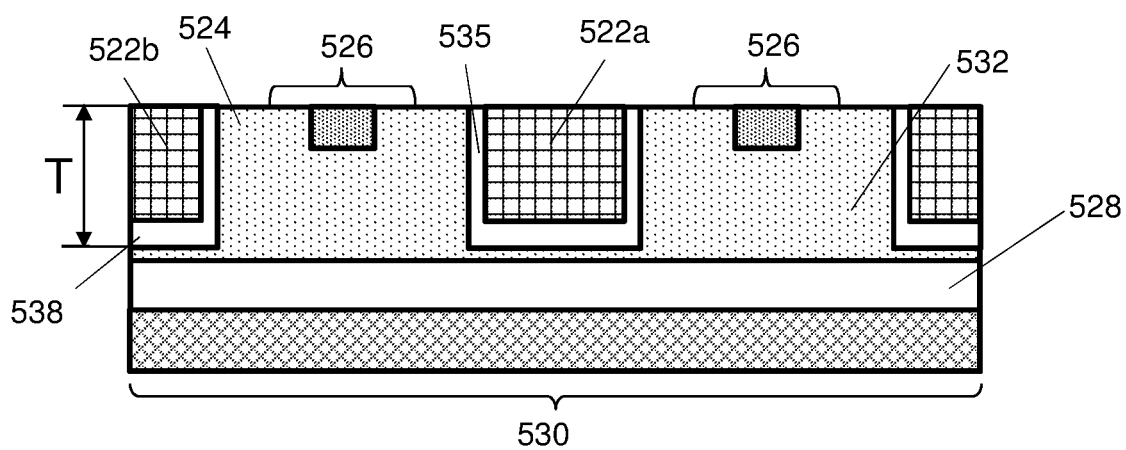
Figure 9C:
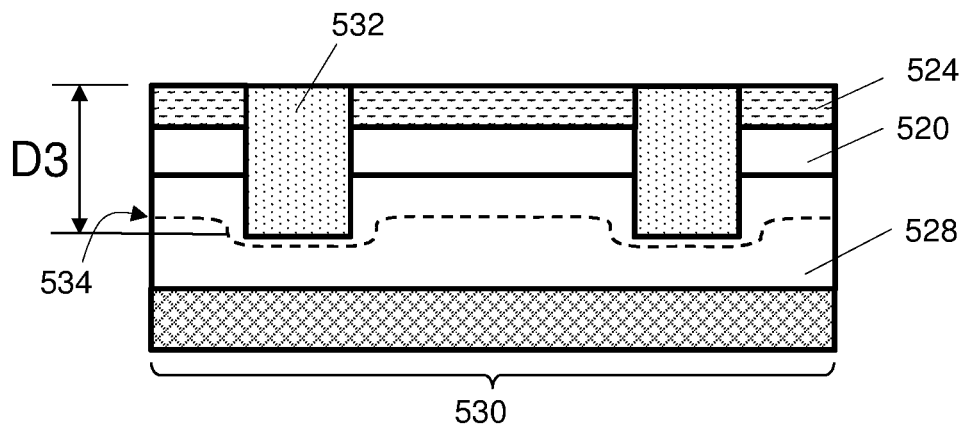
Figure 9D:
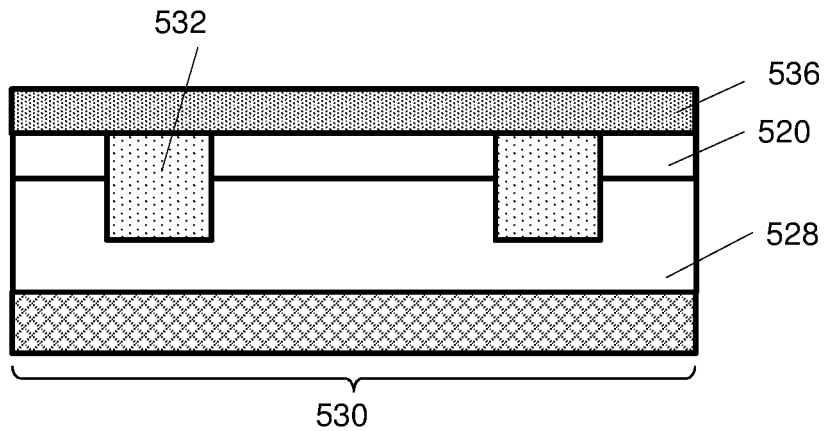

FIGS. 8-9d illustrate a trench SiC MOSFET device according to a further embodiment of the invention. Similar to the MOSFET devices in FIGS. 1-5b, for the MOSFET device in FIGS. 8-9d the same idea of P+ portions placed perpendicular to N+ portions is applied, but now in a trench MOSFET device. The P+ portions act as a shield to allow the gate oxide near the bottom of the trench to be protected. The P+ portions connect to a source contact directly so the body diode performance can be much improved.

In particular, the trench MOSFET device arranges a source, a channel, and a drain, which make up the silicon pillar vertically (as shown in FIGS. 9a-9d). In particular, a silicon carbide substrate 530 is configured as the underlying structure and epitaxy of the MOSFET device in FIG. 9a. In this embodiment the silicon carbide substrate 530 is of N+ type as a first dopant type. There is also a metal layer (not shown) formed at the bottom side of the silicon carbide substrate 530 as an ohmic contact to be used as the drain contact of the MOSFET device. On top of the silicon carbide substrate 530, there is a first silicon carbide layer 528 of N− type, and the first silicon carbide layer 528 functions as an N− drift layer. The first silicon carbide layer 528 has lower doping than the silicon carbide substrate 530 and they are respectively designated using N− and N+. Unlike the embodiments in FIGS. 1-5b, the first silicon carbide layer 528 does not extend upward all the way to the top surface 519 of the SiC structure of the MOSFET device.

On top of the first silicon carbide layer 528 there are two P-base portions 521 configured, which together form a second silicon carbide layer. The two P-base portions 521 each has a strip shape and contains P− type dopants. The two P-base portions 521 are symmetrical about a central virtual plane 518 that is perpendicular to the silicon carbide substrate 530. A trench gate formed by a gate polysilicon portion 522a encapsulated (except for the top face) by a trench gate oxide 535 and a trench bottom oxide 538, is configured between the two P-base portions 521. It should be noted that the trench gate oxide 535 and the trench bottom oxide 538 are of the same material, but are manufactured at the different process and different step (as will be described in details later). They also refer to different thickness of oxide at different faces of the encapsulated gate polysilicon portion 522a. Also, at the side of each P-base portion 521 away from the virtual plane 518, there are partial trench gate structures. Each partial trench gate at the side edge contains a gate polysilicon portion 522b encapsulated by a trench gate oxide 535 and a trench bottom oxide 538. One can see that in FIG. 9a the partial trench gate will form full trench gate when they extend along the direction normal to central virtual plane 518.

On top of each P-base portion 521 there are configured two N+ portions 524 separated by a first P+ portion 536 (which are P+ source junctions), all of which have a strip shape. The two N+ portions 524 have equal width, and are disposed respectively on two opposite sides of the trench gate oxide 535. The N+ portions 524 form a third silicon carbide layer. The N+ portions 524, the first P+ portions 536, and the trenches are all parallel to each other and extend along a direction that is parallel to the virtual plane 518 as well as the silicon carbide substrate 530. In addition, there are two second P+ portions 532 that extend along a direction transverse to the N+ portions 524, the first P+ portions 536, and the trenches, and the second P+ portions 532 form a fourth silicon carbide layer. As best shown in FIG. 9a, the N+ portions 524, the first P+ portions 536, and the trenches all have their top faces flush with the top surface 519 of the SiC structure of the MOSFET device. In this way it can be said that the N+ portions 524, the first P+ portions 536, and the trenches are embedded at a top portion of the first silicon carbide layer 528.

In the trenches of the MOSFET device, the thickness of the trench bottom oxide 538 can be the same as the thickness of the trench gate oxide 535, but it can also be thicker than the thickness of the trench gate oxide 535 to provide more protection. If there is thicker oxide at the trench bottom, the second P+ portions 532 (see the depth D3 of the second P+ portions 532 in FIG. 9c) can be shallower or deeper than the total depth of the trenches T (see FIG. 9a). If there is no thicker oxide at the trench bottom, the second P+ portions 532 need to be deeper than the trench to provide effective shielding. In the embodiments shown in FIGS. 8-9d, the thickness of the trench bottom oxide 538 is 150 nm, while the thickness of the trench gate oxide 535 is 50 nm.

FIGS. 9a and 9c respectively show the depletion region 534 of the trench MOSFET device. In FIG. 9a where the cross-section of the MOSFET device along a direction perpendicular to the trenches is shown, one can see that the depletion region 534 has a flat shape as delimited by the two parallel dash lines which indicates the trench gate oxide 535 is protected. In FIG. 9c where the cross-section of the MOSFET device along a direction parallel to the trenches is shown, one can see that the depletion region 534 has an uneven shape it is delimited by the bottom end of the second P+ regions 532.

The width W of the second P+ portions 532 shown in FIG. 8 have similar design constraint as those mentioned in previous embodiments, and in particular W should be the minimum dimension the manufacturing process of the trench MOSFET device can produce. In the embodiment shown in FIGS. 8-9d, as mentioned above, the junction depth D3 of the second P+ portions 532 is larger than the trench depth T to ensure the trench gate oxide 535, from the edge of P-base portions 521 to the bottom of the trench, is protected by the overlapping of the depletion. The scale of protection depends on a few factors, namely the doping concentration of the first silicon carbide layer 528, a trench spacing J between the trenches (see FIG. 8), and the difference between D3 and T(D3−T). In this embodiment, the N-drift doping concentration of the first silicon carbide layer 528 is 1.0e16/cm$^3$, the trench junction depth T is 1.5 μm, the trench spacing J is 1.6 μm, the junction depth D3 of the second P+ portions 532 is 1.8 μm, and the spacing S of the second P+ portions 532 is 1.8 μm.

In another specific implementation of the MOSFET device in FIGS. 8-9d, the silicon carbide substrate 530 is a N+ doped 4H-SiC, 3C-SiC, or 6H-SiC semiconductor layer, with thickness around 350 μm and resistivity from 0.02 Ω·cm to 0.03 Ω·cm. The first silicon carbide layer 528 is an N− epitaxial layer with a thickness in the range of 4 μm to 35 μm, and a doping concentration in the range of 1e15 cm$^3$ to 3e16 cm$^3$. The P-base portions 521 contains aluminium dopant, with a junction depth in the range of 0.6 μm to 1.2 μm, and a doping concentration in the range of 1e17 cm$^3$ to 5e18 cm$^{-3}$. The second P+ portions 532 contains aluminium dopant, with a doping concentration in the range of 5e19 cm$^{-3}$ to 2e20 cm$^{-3}$, and a peak doping near the top surface being 2e20 cm$^{-3}$. Whereas, the peak doping near the bottom of the second P+ portions 532 is 8e19 cm$^3$. The N+ portions 524 contains nitrogen or phosphorus dopant, with a junction depth in the range of 0.2 μm to 0.5 μm, and a doping concentration in the range of 1e20 cm$^{-3}$ to 1.5e20 cm$^3$. The first P+ portions 536 contains aluminium dopant, with a doping concentration in the range of 5e19 cm$^{-3}$ to 2e20 cm$^{-3}$, and a junction depth in the range of 0.2 μm to 0.5 μm. The trenches each has a width in the range of 0.5 μm to 1.2 μm, and a depth T in the range of 1.0 μm to 1.8 μm, preferably 1.5 μm. The trench gate oxide 535 is a silicon dioxide with a thickness in the range of 20 nm to 70 nm. The trench bottom oxide 538 is a silicon dioxide with a thickness in the range of 100 nm to 400 nm. Lastly, the conductive material applied on the gate polysilicon portion 522a and 522b is a polysilicon with in-situ doping to fill up the trench.

It should be noted that in FIGS. 8-9d, the metal terminals of the MOSFET device are not shown, which as skilled persons would understand are formed by conductive materials deposited over the gate polysilicon portion 522a and 522b, the underside of the silicon carbide substrate 530, and source regions 626 formed by the N+ portions 524 and the first P+ portions 536 to form respectively the gate terminal, the drain terminal and the source terminal.

Figure 10:
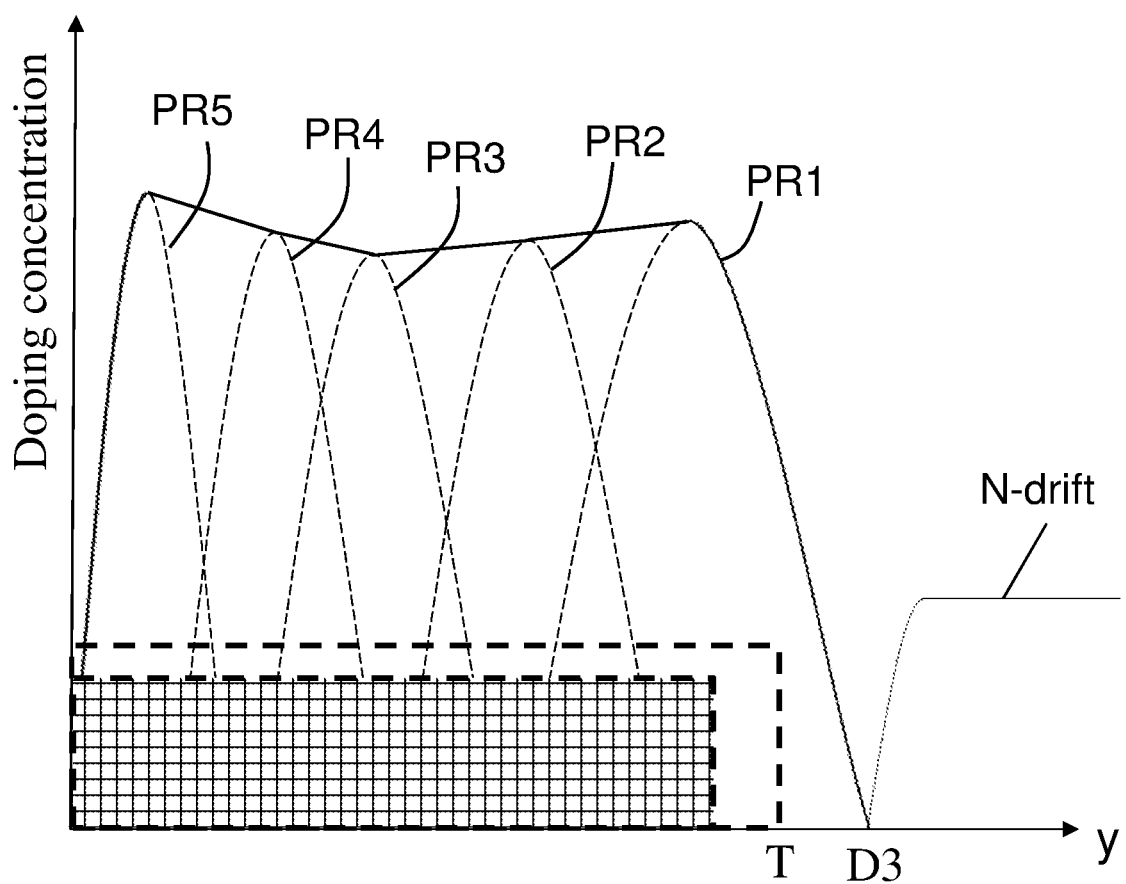
FIG. 10 illustrates the doping junction profile of P+ region in the MOSFET device in FIG. 8.

Turning to FIG. 10, in which the doping profile of the second P+ portions 532 is illustrated. The junction depth D3 of the second P+ portions 532 is designed to be larger than the trench depth T. This is to ensure that the hard mask is thick enough to block the ion implantation at the non-P+ region. This requires the photolithography and etching process to provide high enough resolution to obtain the require geometry. The doping of the second P+ portions 532 is showing a double-peaks profile. The surface of the second P+ portions 532 (i.e. near the top surface 519 in FIG. 9a) is highly doped to form the ohmic contact. The doping concentration at bottom of the second P+ portions 532 is also highly doped to boost efficiency of body diode. The dopants (such as aluminium ions) are implanted to the first silicon carbide layer 528 by using the patterned hard mask. There are a series of implantations, typical 3 to 6 steps, with different dosage and energy to achieve the required profile. In the specific implementation shown in FIG. 10, the P+ region doping consists of five consecutive ions implantation, namely PR1, PR2, PR3, PR4 and PR5. As illustrated, PP1 corresponds to the ion implantation with highest energy, and therefore it results in the deepest projection range. PR2 and PR3 are ion implantations with gradually lower energy and dose so that each junction profiles are overlapped smoothly. To achieve the ohmic contact, PR4 and PR5 are ion implantations with doses going higher when the implantation energy go lower.

Figure 11A:
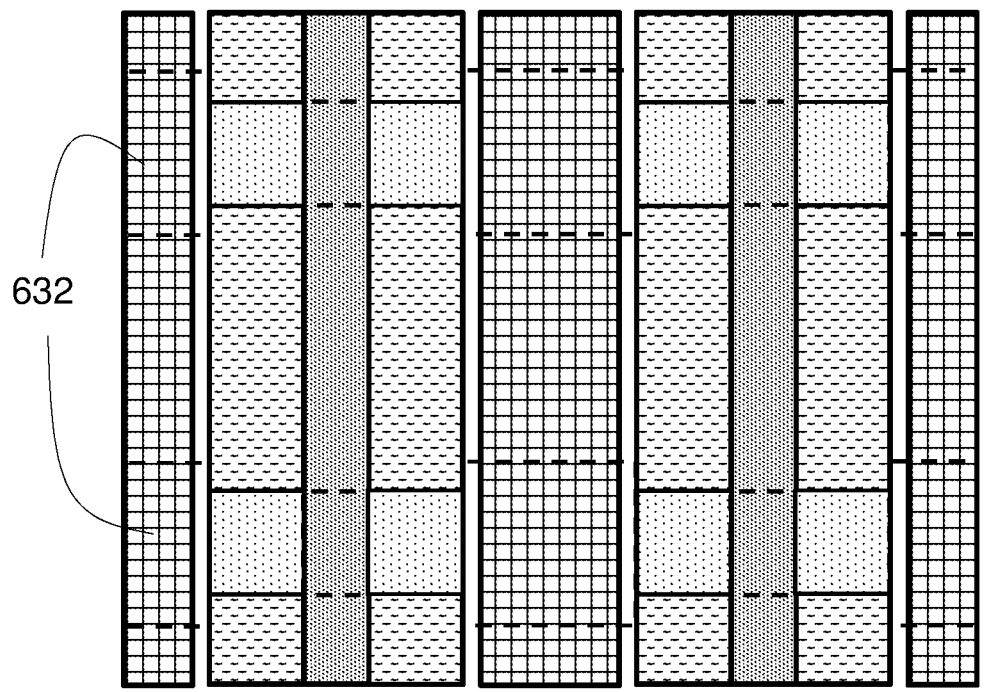
FIGS. 11a-11c illustrate various modifications to the geometry of P+ region in the MOSFET device in FIG. 8.
Figure 11B:
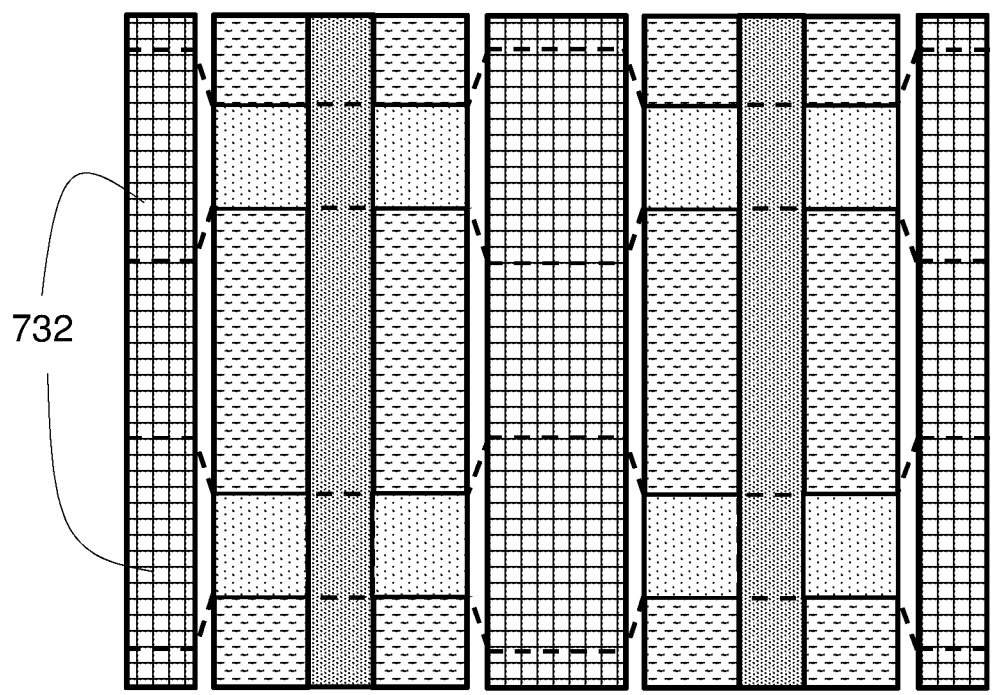
Figure 11C:
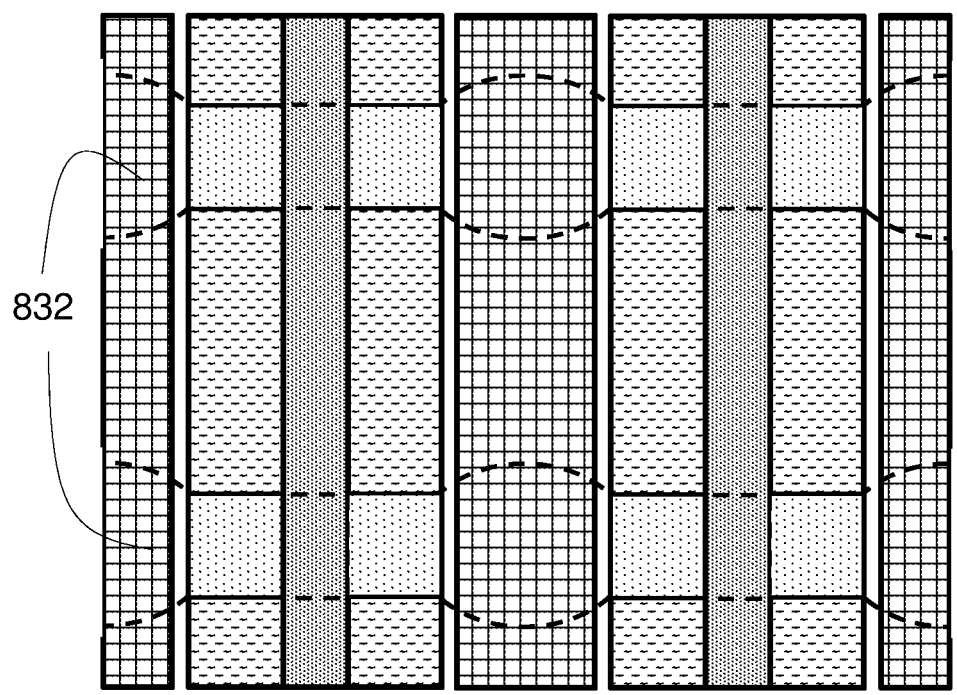

Next, FIGS. 11a-11c show variations of the embodiment in FIGS. 8-9d mentioned above, in which the geometry of the second P+ portions are changed. The geometry of the second P+ portions 532 can be changed to balance among parameters such as body diode performance, MOSFET channel density, protection to the trench gate oxide 535 from electric field. The embodiment in FIGS. 8-9d uses the strip-type second P+ portions 532, but it is not the only possible geometry that can be used. In FIG. 11a, the second P+ portions 632 each has an I-beam shape in the top view. In FIG. 11b, the second P+ portions 732 each has a dumbbell shape in the top view. In FIG. 11c, the second P+ portions 832 each has a bamboo type.

Figure 12:
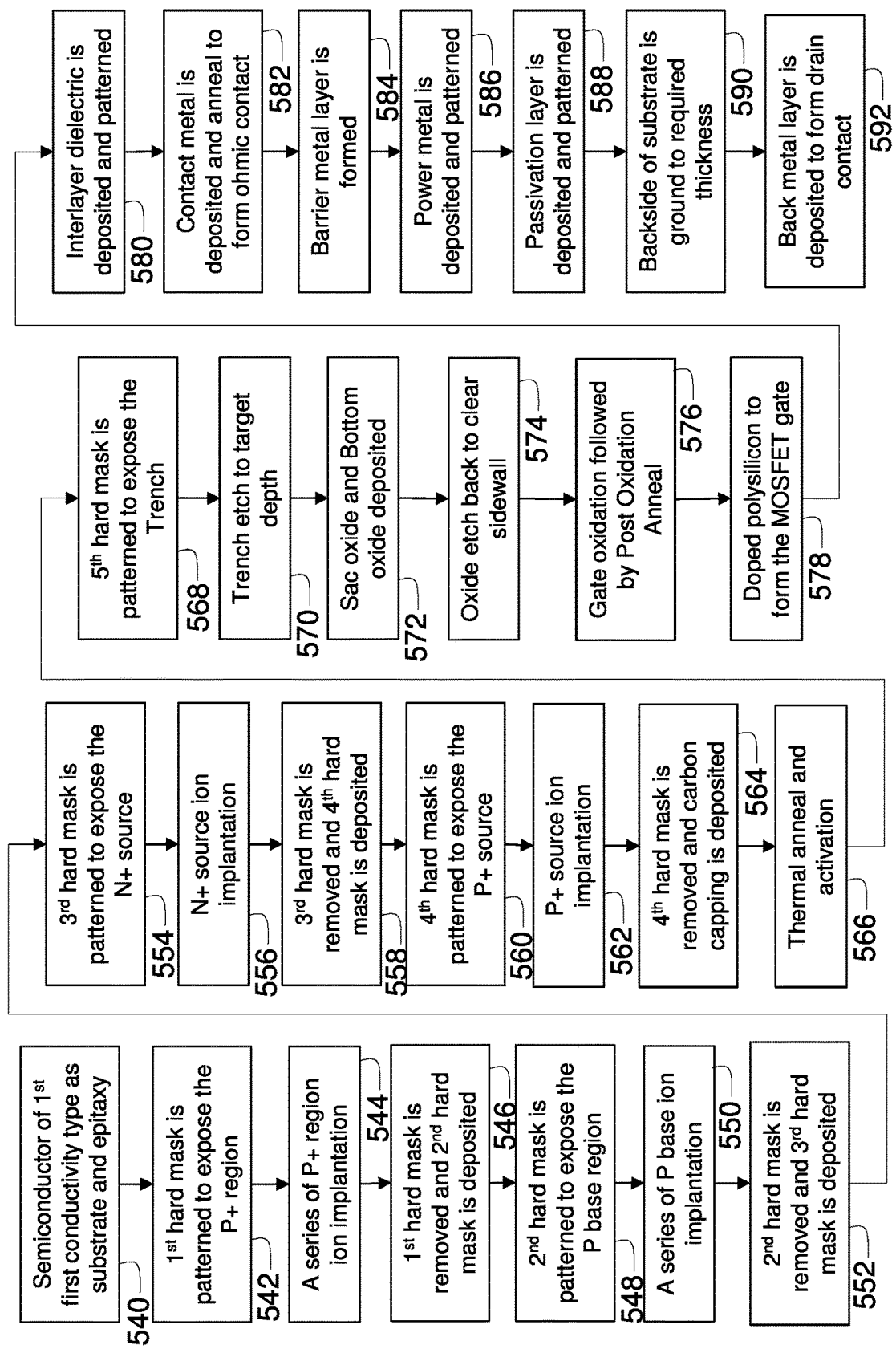
FIG. 12 shows a flowchart of the major steps in manufacturing the MOSFET device in FIG. 8.

FIG. 12 shows an exemplary method of how to produce the trench MOSFET device in FIGS. 8-9d. Note that the exemplary method described in this embodiment is not intended to be limiting, as the same MOSFET device may be produced using other methods, and/or with different sequences of the steps. The method starts at Step 540 in which a raw silicon carbide epi wafer which has been cleaned using the RCA clean procedures is prepared. The wafer comes with a silicon carbide substrate of N+ type and a first silicon carbide layer on top thereof which is of N− type. As mentioned previously the first silicon carbide layer is an epitaxy N− drift layer less doped than the silicon carbide substrate. Then, in Step 542 a first hard mask (e.g. dielectric mask such as SiO$_2$) is applied to the first silicon carbide layer. The hard mark process for example may be done by Plasma Enhanced Chemical Vapor Deposition (PECVD) by using tetraethylorthosilicate (TEOS) on the wafer, and in particular on the top side of the first silicon carbide layer, so that a layer of oxide is formed on the surface of the wafer. Then, an oxide hard mask layer is patterned (not shown) through conventional lithography such as optical, ion and electron beam lithography, and oxide etching process in order to expose portions of the first silicon carbide layer that are intended to form second P+ portions. In Step 544, a series of P+ ion implantations are carried out from the top surface of the first silicon carbide layer in a manner such as those shown in FIG. 10 to make the second P+ portions. In Step 546, the first hard mask is removed, and the next, second hard mask is deposited on the first silicon carbide layer using the same process as the first hard mask. The thickness of second hard mask can be the same or different from the first hard mask, but the second hard mask must be thick enough to absorb the ions at masking sites. In Step 548 the second hard mask is patterned to expose portions of the first silicon carbide layer that are intended to form P-base portions. In Step 550, a series of P− ion implantations are carried out to make a P-base layer in the first silicon carbide layer. In Step 552, the second hard mask is removed, and the next, third hard mask is deposited on the first silicon carbide layer using the same process as the first hard mask. The thickness of third hard mask can be the same or different from previous hard masks, but the third hard mask must be thick enough to absorb the ions at masking sites. In Step 554, the third hard mask is patterned to expose portions of the first silicon carbide layer that are intended to form N+ portions. In Step 556, N+ source ion implantations are conducted at the top surface of the first silicon carbide layer to form an N+ layer that is intended to be used together with first P+ portions as source regions. The N+ ion implantations can counter-dope the P-base portions, but cannot counter-dope the second P+ portions. Next, In Step 558 the third hard mask is removed, and the next, fourth hard mask is deposited on the first silicon carbide layer using the same process as first hard mask. The thickness of fourth hard mask can be the same or different from previous hard masks, but the fourth hard mask must be thick enough to absorb the ions at masking sites. In Step 560, the fourth hard mask is patterned to expose portions of the first silicon carbide layer that are intended to form the first P+ portions. In Step 562, P+ source ion implantations are conducted at the top surface of the first silicon carbide layer to form first P+ portions that are intended to be used together with the N+ portions as source regions. The first P+ portions must not overlap to the N+ portions, can choose to overlap or not overlap to the second P+ portions. In Step 564, the fourth hard mask is removed, and carbon capping is deposited on the top surface of the SiC structure. In Step 566, with the carbon capping ready the whole SiC structure then undergoes thermal anneal and activation. In Step 568 a fifth hard mask is deposited on the first silicon carbide layer using the same process as the first hard mask. The thickness of the fifth hard mask can be the same or different from previous hard masks, but the fifth hard mask must be thick enough to maintain the good sidewall profile during the trench etch. This hard mask is then patterned to expose portions of the first silicon carbide layer that are intended to form the trenches. Next, in Step 570 the trenches are etched out to their target depth. Note that as shown in FIG. 9a-9d the trenches will invade into the N+ layer and the P-base layer so that separate N+ portions as well as P-base portions are formed. In Step 572 sac oxide is deposited and removed immediately to remove the trench etch defect and smoothen the surface of the trench sidewall. Then bottom oxide is deposited into the trenches. The bottom oxide process for example may be done by High Density Plasma Chemical Vapor Deposition (HDPCVD). The process results in thicker oxide at trench bottom and thinner oxide at trench sidewall. In Step 574 the oxide is etched back to clear sidewall and only remain oxide at trench bottom, and in Step 576 the gate oxidation is grown at the trench sidewall, and post oxidation anneal is then performed. In Step 578 doped polysilicon is deposited to cover the trench bottom oxide and the trench gate oxide portion to form the MOSFET gate. In Step 580 the ILD is deposited on top of the entire MOSFET. The ILD is then patterned by photolithography and etching process on the top face of the portions of the first silicon carbide layer, leaving contacts for the ohmic metal later. In Step 582 a layer of ohmic metal is deposited on the entire MOSFET device, and the ohmic metal fills in the previously mentioned contacts and then undergoes an annealing process. The ohmic contacts of the MOSFET device are thus formed. In Step 584 a barrier metal layer is formed on top of the ohmic metal, and in Step 586 a layer of power metal is deposited and patterned on top of the barrier metal layer. In Step 588 a passivation layer is deposited and patterned on top of the power metal. In Step 590 a backside of the silicon carbide substrate is grounded to a required thickness. Finally, in Step 592 a back metal layer is deposited at the backside of the silicon carbide substrate to form drain contact of the MOSFET device. To this step the manufacturing of the MOSFET device is then completed.

Figure 13:
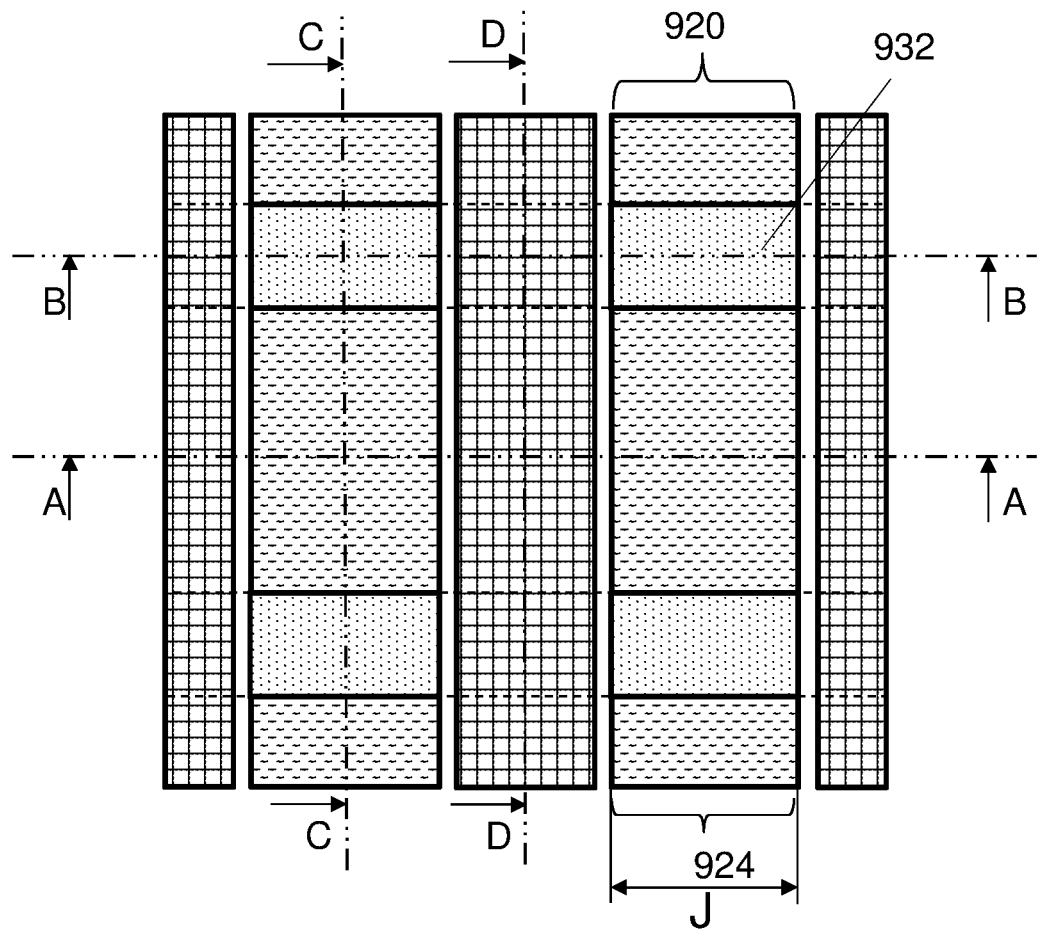
FIG. 13 shows the active cell layout of a trench MOSFET device according to a fourth embodiment of the invention.
Figure 14A:
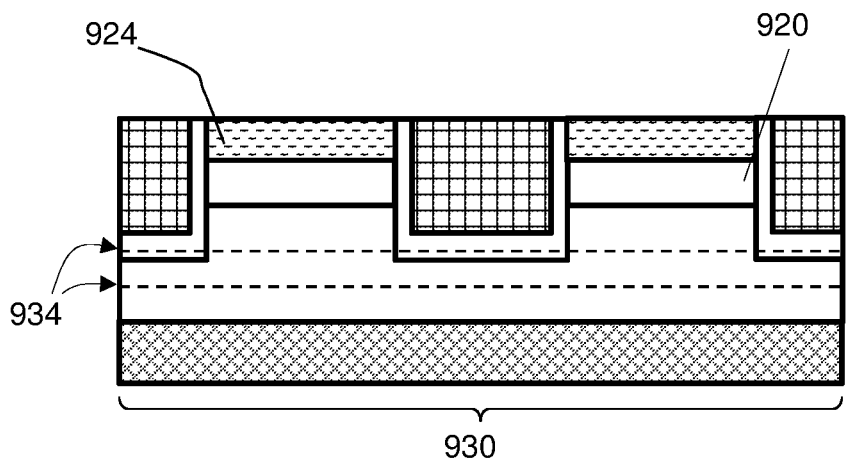
FIGS. 14a-14d are cross-sectional views of the MOSFET device in FIG. 13 respectively along lines A-A, B-B, C-C and D-D.
Figure 14B:
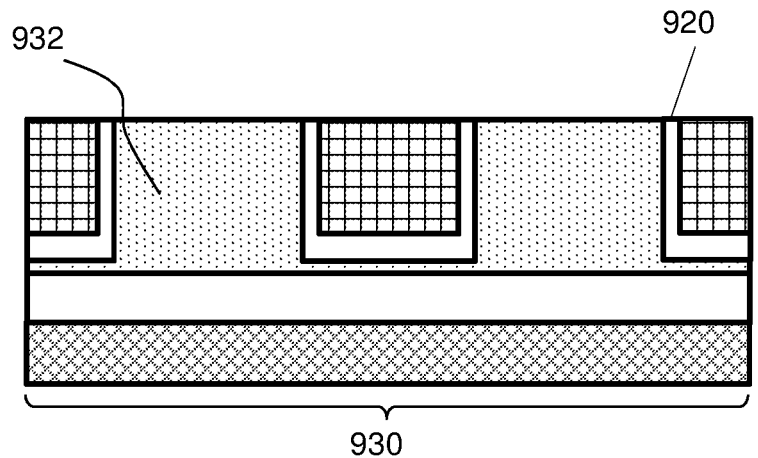
Figure 14C:
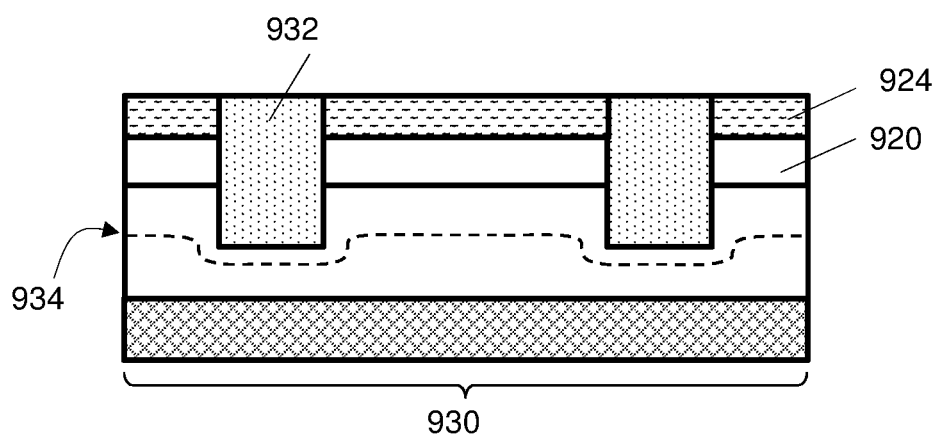
Figure 14D:
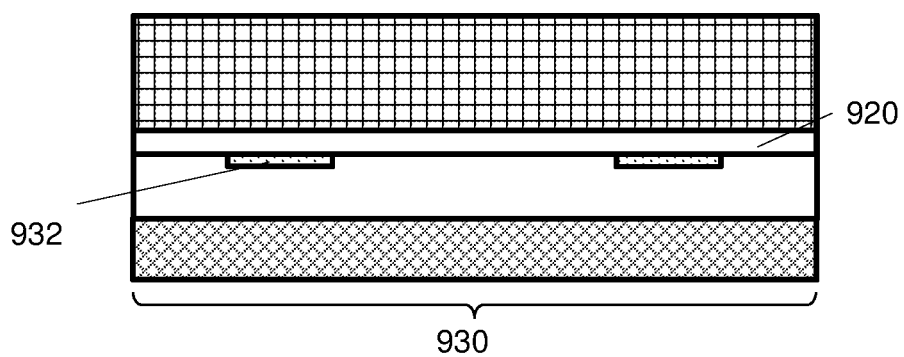

Referring to FIGS. 13-14d, a further embodiment of the invention is now described, which similar to that in FIGS. 8-9d is a trench SiC MOSFET device. Most of the features of the MOSFET device in FIGS. 13-14d are similar to those of the silicon carbide diode array in FIGS. 8-9d so they will not be described again here for the sake of brevity. Only the difference between the MOSFET devices in FIG. 13-14d and FIGS. 8-9d will be described herein. In particular, unlike the embodiment in FIGS. 8-9d where there are first P+ portions arranged in parallel to the N+ portions, the first P+ portions (i.e. P+ source junctions) are eliminated in the MOSFET device in FIGS. 13-14d. Rather the N+ Portions 924 extend fully between adjacent trenches. The trench spacing J as shown in FIG. 13 is 1.6 μm. All the other structures, dimensions, and design constraints for the MOSFET device in FIGS. 13-14d are the same as those of the MOSFET device in FIGS. 8-9d.

Figure 15A:
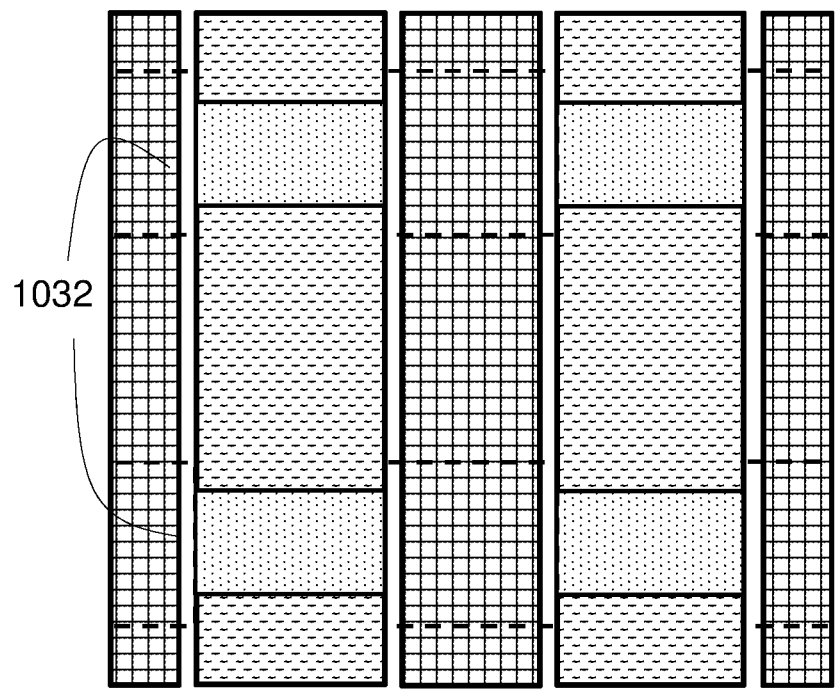
FIGS. 15a-15c illustrate various modifications to the geometry of P+ region in the MOSFET device in FIG. 13.
Figure 15B:
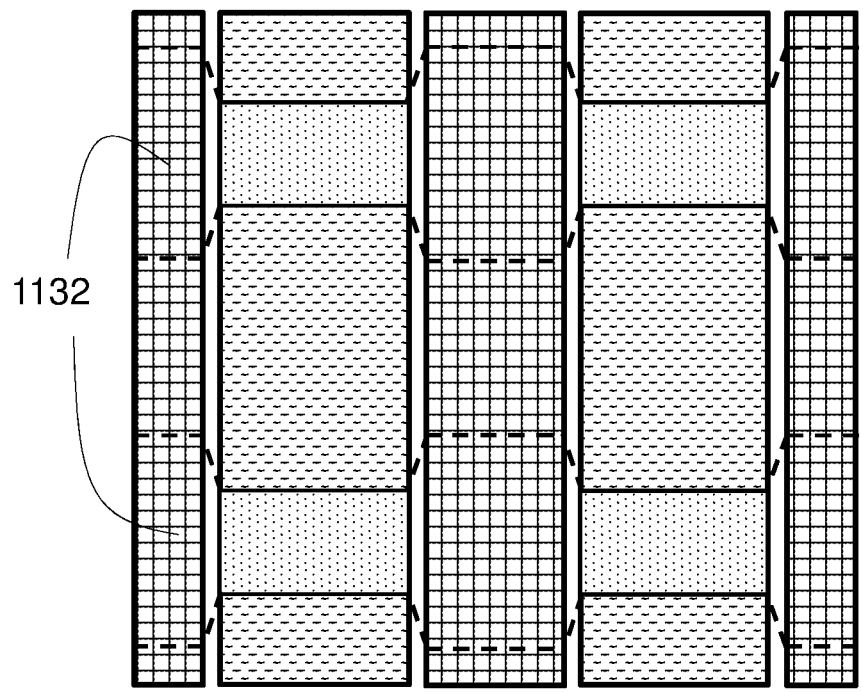
Figure 15C:
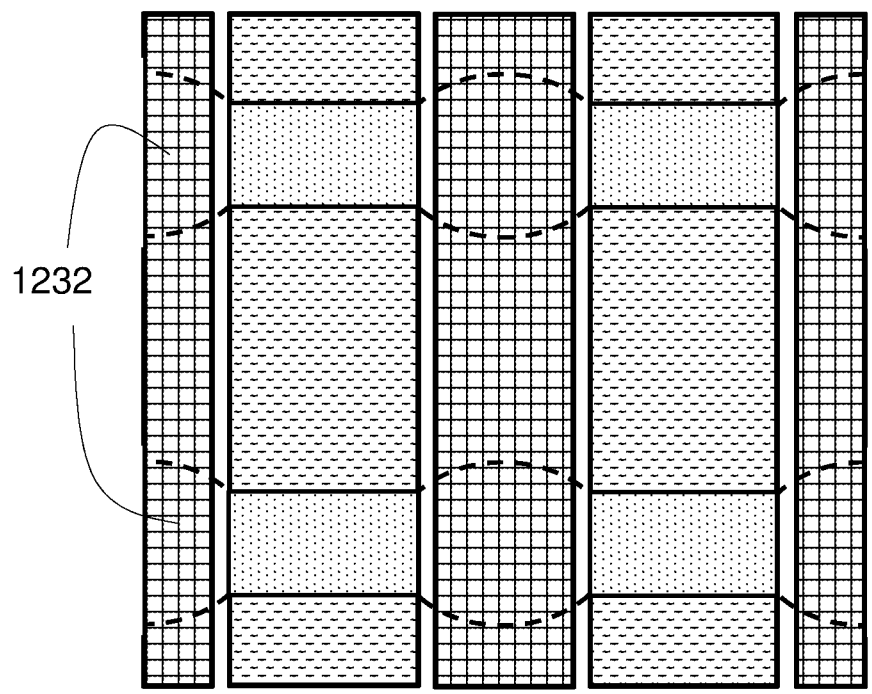

Next, FIGS. 15a-15c show variations of the embodiment in FIGS. 13-14d mentioned above, in which the geometry of the second P+ portions 932 are changed. The geometry of the second P+ portions 932 can be changed to balance among parameters such as body diode performance, MOSFET channel density, protection to the gate oxide from electric field. The embodiment in FIGS. 13-14d uses the strip-type second P+ portions 932, but it is not the only possible geometry that can be used. In FIG. 15a, the second P+ portions 1032 each has an I-beam shape in the top view. In FIG. 15b, the second P+ portions 1132 each has a dumbbell shape in the top view. In FIG. 15c, the second P+ portions 1232 each has a bamboo type.

Figure 16:
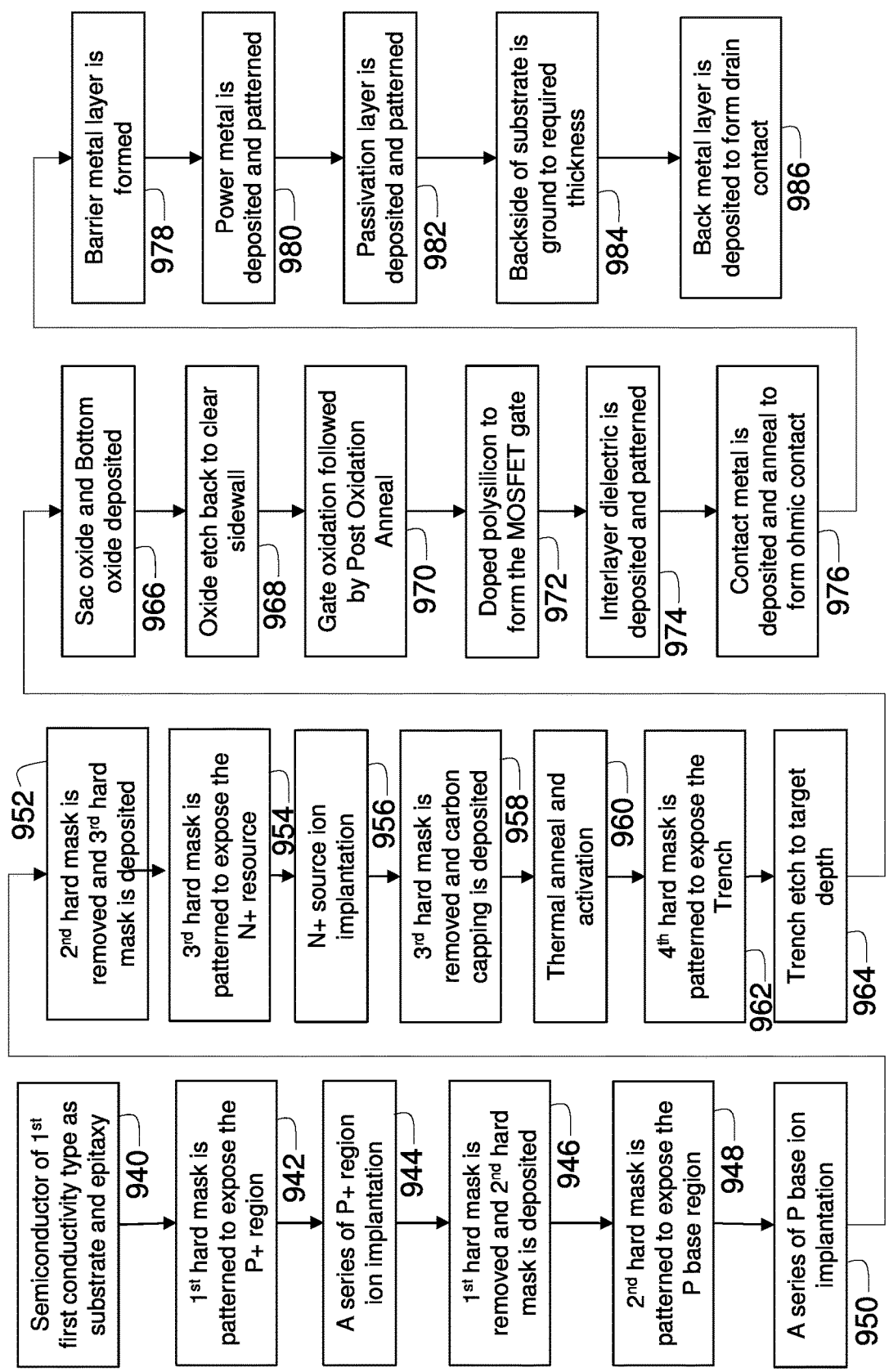
FIG. 16 shows a flowchart of the major steps in manufacturing the MOSFET device in FIG. 13.

FIG. 16 shows an exemplary method of how to produce the trench MOSFET device in FIGS. 13-14d. Note that the exemplary method described in this embodiment is not intended to be limiting, as the same MOSFET device may be produced using other methods, and/or with different sequences of the steps. The method starts at Step 940 in which a raw silicon carbide epi wafer which has been cleaned using the RCA clean procedures is prepared. The wafer comes with a silicon carbide substrate of N+ type and a first silicon carbide layer on top thereof which is of N− type. As mentioned previously the first silicon carbide layer is an epitaxy N− drift layer less doped than the silicon carbide substrate. Then, in Step 942 a first hard mask (e.g. dielectric mask such as $SiO_2$) is applied to the first silicon carbide layer. The hard mask process for example may be done by Plasma Enhanced Chemical Vapor Deposition (PECVD) by using tetraethylorthosilicate (TEOS) on the wafer, and in particular on the top side of the first silicon carbide layer, so that a layer of oxide is formed on the surface of the wafer. Then, an oxide hard mask layer is patterned (not shown) through conventional lithography such as optical, ion and electron beam lithography, and oxide etching process in order to expose portions of the first silicon carbide layer that are intended to form second P+ portions. In Step 944, a series of P+ region ion implantations are carried out from the top surface of the first silicon carbide layer in a manner such as those shown in FIG. 10 to make the second P+ portions. In Step 946, the first hard mask is removed, and the next, second hard mask is deposited on the first silicon carbide layer using the same process as first hard mask. The thickness of second hard mask can be the same or different from the first hard mask, but the second hard mask must be thick enough to absorb the ions at masking sites. In Step 948 the second hard mask is patterned to expose portions of the first silicon carbide layer that are intended to form P-base portions. In Step 950, a series of P-base ion implantations are carried out to make a P-base layer in the first silicon carbide layer. In Step 952, the second hard mask is removed, and the next, third hard mask is deposited on the first silicon carbide layer using the same process as the first hard mask. The thickness of third hard mask can be the same or different from previous hard masks, but the third hard mask must be thick enough to absorb the ions at masking sites. In Step 954, the third hard mask is patterned to expose portions of the first silicon carbide layer that are intended to form N+ portions. In Step 956, N+ source ion implantations are conducted at the top surface of the first silicon carbide layer to form an N+ layer that is intended to be used as source regions. The N+ ion implantations can counter-dope the P-base portions, but cannot counter-dope the second P+ portions. Next, in Step 958, the third hard mask is removed, and carbon capping is deposited on the top surface of the SiC structure. In Step 960, with the carbon capping ready the whole SiC structure then undergoes thermal anneal and activation. In Step 962 a fourth hard mask is deposited on the first silicon carbide layer using the same process as first hard mask. The thickness of the fourth hard mask can be the same or different from previous hard masks, but the fourth hard mask must be thick enough to maintain the good sidewall profile during the trench etch. This hard mask is then patterned to expose portions of the first silicon carbide layer that are intended to form the trenches. Next, in Step 964 the trenches are etched out to their target depth. Note that as shown in FIG. 14a-14d the trenches will invade into the N+ layer and the P-base layer so that separate N+ portions as well as P-base portions are formed. In Step 966 sac oxide is deposited and etched immediately to remove the trench etch defect and smoothen the surface of the trench sidewall. Then bottom oxide is deposited into the trenches. The bottom oxide process for example may be done by High Density Plasma Chemical Vapor Deposition (HDPCVD). The process results in thicker oxide at trench bottom and thinner oxide at trench sidewall. In Step 968 the oxide is etched back to clear sidewall and only remain oxide at trench bottom, and in Step 970 the gate oxidation is grown at the trench sidewall, and post oxidation anneal is then performed. In Step 972 doped polysilicon is deposited to cover the trench bottom oxide and the trench gate oxide portion to form the MOSFET gate. In Step 974 the ILD is deposited on top of the entire MOSFET device. The ILD is then patterned by photolithography and etching process on the top face of the portions of the first silicon carbide layer, leaving contacts for the ohmic metal later. In Step 976 a layer of ohmic metal is deposited on the entire MOSFET device, and the ohmic metal fills in the previously mentioned contacts and then undergoes an annealing process. The ohmic contacts of the MOSFET device are thus formed. In Step 978 a barrier metal layer is formed on top of the ohmic metal, and in Step 980 a layer of power metal is deposited and patterned on top of the barrier metal layer. In Step 982 a passivation layer is deposited and patterned on top of the power metal. In Step 984 a backside of the silicon carbide substrate is grounded to a required thickness. Finally, in Step 986 a back metal layer is deposited at the backside of the silicon carbide substrate to form drain contact of the MOSFET device. To this step the manufacturing of the MOSFET device is then completed.

Figure 17:
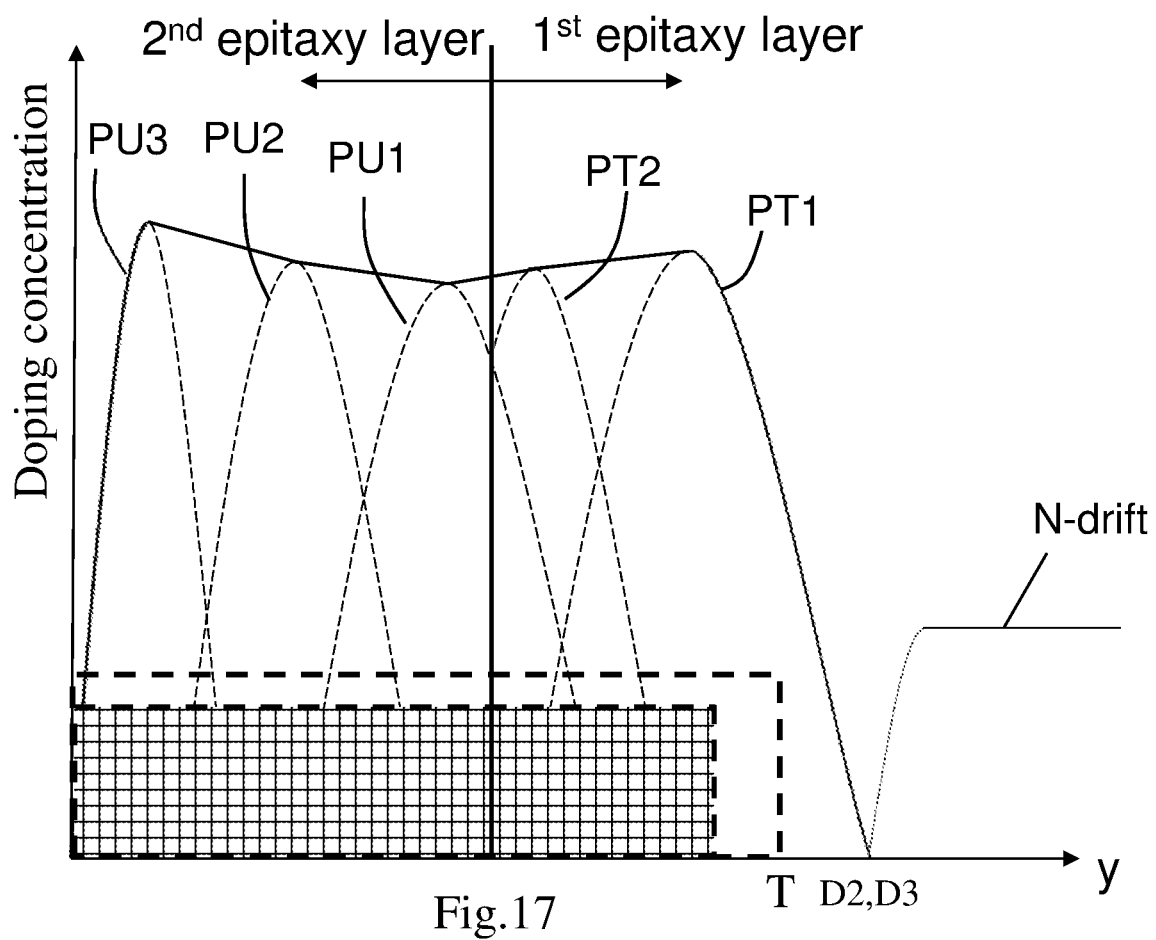
FIG. 17 illustrates the doping junction profile of P+ region in a MOSFET device according to a fifth embodiment of the invention.

Turning to FIG. 17, which illustrates an alternative method to form a deeper P+ portions in the MOSFET device. For SiC structures require a deep P+ region junction depth, such as the devices shown in FIGS. 5a, 8, 9a-9d and 13-14d, the alternative method could product the double-peaks profile of the P+ region doping using two separate implant process. This approach does not require high energy implantation and does not require thick blocking hard mask, which allow smaller geometry of design pattern and better area efficiency. Referring to the graph in FIG. 17, to carry out the alternative method a first series of dopants, typical one to three steps (such as aluminum ions) are implanted into the 1st epitaxy layer by using the patterned hard mask. In this embodiment, the 1st P+ region doping consists of two ions implantation, namely PT1 and PT2. The 2nd epitaxy layer is then deposited on top of the $1^{st}$ epitaxy layer. This 2nd epitaxy layer has thickness in the range of 0.5 μm to 3 μm, doping concentration the same as the 1st epitaxy layer, but it can also be lower or higher than the 1st epitaxy layer. To form the complete doping profile, the second series of dopants, typical two to four steps (such as aluminum ions) are implanted into the 2nd epitaxy layer by using the patterned hard mask. In this embodiment, the 2nd P+ region doping consists of three ions implantation, namely PU1, PU2 and PU3. The second series of dopants has to join the first series of dopants provide connection. The patterned hard mask of the 2nd P+ region doping can be the same, smaller or larger than the patterned hard mask of the 1st P+ region doping.

Figure 18:
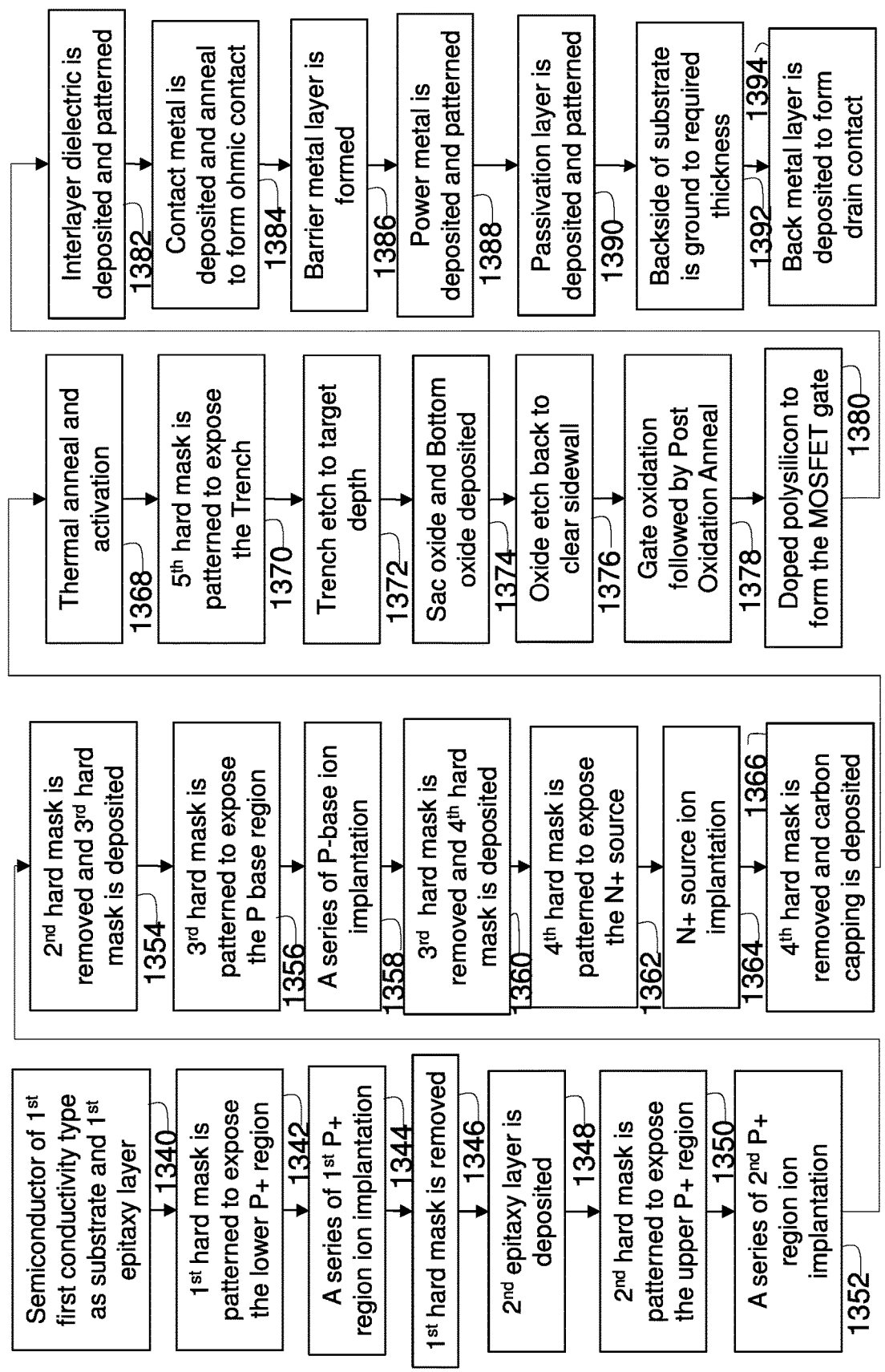
FIG. 18 shows a flowchart of the major steps in manufacturing the MOSFET device according to the doping junction profile in FIG. 17.

FIG. 18 shows an exemplary method of how to produce the trench MOSFET device illustrated in FIGS. 13-14d according to the approach described in FIG. 17. Note that the exemplary method described in this embodiment is not intended to be limiting, as the same MOSFET device may be produced using other methods, and/or with different sequences of the steps. The method starts at Step 1340 in which a raw silicon carbide epi wafer which has been cleaned using the RCA clean procedures is prepared. The wafer comes with a silicon carbide substrate of N+ type and a first epitaxy layer on top thereof which is of N− type. Then, in Step 1342 a first hard mask (e.g. dielectric mask such as $SiO_2$) is applied to the first epitaxy layer. The hard mask process for example may be done by Plasma Enhanced Chemical Vapor Deposition (PECVD) by using tetraethyl-orthosilicate (TEOS) on the wafer, and in particular on the top side of the first epitaxy layer, so that a layer of oxide is formed on the surface of the wafer. Then, an oxide hard mask layer is patterned (not shown) through conventional lithography such as optical, ion and electron beam lithography, and oxide etching process in order to expose portions of the first epitaxy layer that are intended to form the lower P+ portions. In Step 1344, a series of first P+ region ion implantations are carried out from the top surface of the first silicon carbide layer in a manner such as those shown in FIG. 17 to make the lower P+ portions. In Step 1346, the first hard mask is removed, and immediately after in Step 1348, a second epitaxy layer is deposited on top of the first epitaxy layer. In Step 1350 the second hard mask is deposited on the second epitaxy layer using the same process as the first hard mask. The thickness of second hard mask can be the same or different from the first hard mask, but the second hard mask must be thick enough to absorb the ions at masking sites. This hard mask is then patterned to expose portions of the second epitaxy layer that are intended to form upper P+ portions. In Step 1352, a series of second P+ region ion implantations are carried out from the top surface of the second epitaxy layer in a manner such as those shown in FIG. 17 to make the upper P+ portions. In Step 1354, the second hard mask is removed, and the next, third hard mask is deposited on the second epitaxy layer using the same process as first hard mask. The thickness of the third hard mask can be the same or different from previous hard masks, but the third hard mask must be thick enough to absorb the ions at masking sites. In Step 1356 the third hard mask is patterned to expose portions of the second epitaxy layer that are intended to form P-base portions. In Step 1358, a series of P-base ion implantations are carried out to make a P-base layer in the second epitaxy layer. In Step 1360, the third hard mask is removed, and the next, fourth hard mask is deposited on the second epitaxy layer using the same process as the first hard mask. The thickness of fourth hard mask can be the same or different from previous hard masks, but the fourth hard mask must be thick enough to absorb the ions at masking sites. In Step 1362, the fourth hard mask is patterned to expose portions of the second epitaxy layer that are intended to form N+ portions. In Step 1364, N+ source ion implantations are conducted at the top surface of the second epitaxy layer to form an N+ layer that is intended to be used as source regions. The N+ ion implantations can counter-dope the P-base portions, but cannot counter-dope the P+ portions. Next, in Step 1366, the fourth hard mask is removed, and carbon capping is deposited on the top surface of the SiC structure. In Step 1368, with the carbon capping ready the whole SiC structure then undergoes thermal anneal and activation. In Step 1370 a fifth hard mask is deposited on the second epitaxy layer using the same process as first hard mask. The thickness of fifth hard mask can be the same or different from previous hard masks, but the fifth hard mask must be thick enough to maintain the good sidewall profile during the trench etch. This hard mask is then patterned to expose portions of the second epitaxy layer that are intended to form the trenches. Next, in Step 1372 the trenches are etched out to their target depth. In Step 1374 sac oxide is deposited and removed immediately to remove the trench etch defect and smoothen the surface of the trench sidewall. Then bottom oxide is deposited into the trenches. The bottom oxide process for example may be done by High Density Plasma Chemical Vapor Deposition (HDPCVD). The process results in thicker oxide at trench bottom and thinner oxide at trench sidewall. In Step 1376 the oxide is etched back to clear sidewall and only remain oxide at trench bottom, and in Step 1378 the gate oxidation is grown at the trench sidewall, and post oxidation anneal is then performed. In Step 1380 doped polysilicon is deposited to cover the trench bottom oxide and the trench gate oxide portion to form the MOSFET gate. In Step 1382 the ILD is deposited on top of the entire MOSFET device.

The ILD is then patterned by photolithography and etching process on the top face of the portions of the first silicon carbide layer, leaving contacts for the ohmic metal later. In Step 1384 a layer of ohmic metal is deposited on the entire MOSFET device, and the ohmic metal fills in the previously mentioned contacts and then undergoes an annealing process. The ohmic contacts of the MOSFET device are thus formed. In Step 1386 a barrier metal layer is formed on top of the ohmic metal, and in Step 1388 a layer of power metal is deposited and patterned on top of the barrier metal layer. In Step 1390 a passivation layer is deposited and patterned on top of the power metal. In Step 1392 a backside of the silicon carbide substrate is grounded to a required thickness. Finally, in Step 1394 a back metal layer is deposited at the backside of the silicon carbide substrate to form drain contact of the MOSFET device. To this step the manufacturing of the MOSFET device is then completed.

The exemplary embodiments of the present invention are thus fully described. Although the description referred to particular embodiments, it will be clear to one skilled in the art that the present invention may be practiced with variation of these specific details. Hence this invention should not be construed as limited to the embodiments set forth herein.

While the invention has been illustrated and described in detail in the drawings and foregoing description, the same is to be considered as illustrative and not restrictive in character, it being understood that only exemplary embodiments have been shown and described and do not limit the scope of the invention in any manner. It can be appreciated that any of the features described herein may be used with any embodiment. The illustrative embodiments are not exclusive of each other or of other embodiments not recited herein. Accordingly, the invention also provides embodiments that comprise combinations of one or more of the illustrative embodiments described above. Modifications and variations of the invention as herein set forth can be made without departing from the spirit and scope thereof, and, therefore, only such limitations should be imposed as are indicated by the appended claims.

What is claimed is:

1. A silicon carbide MOSFET device, comprising:
    a) a silicon carbide substrate of a first dopant type;
    b) a first silicon carbide layer of the first dopant type on top of the silicon carbide substrate, the first silicon carbide layer having lower doping than the silicon carbide substrate and defining a drift region;
    c) a second silicon carbide layer of a second dopant type embedded in a top portion of the first silicon carbide layer; the second silicon carbide layer comprising a plurality of second portions that run substantially along a first direction;
    d) a third silicon carbide layer of the first dopant type embedded in a top portion of the second silicon carbide layer; the third silicon carbide layer having higher doping than the first silicon carbide layer; the third silicon carbide layer comprising a plurality of third portions that run substantially along the first direction; and
    e) a gate oxide layer overlapped to the first silicon carbide layer, the second silicon carbide layer and the third silicon carbide layer; and in touch with a polysilicon layer;
    wherein, the device further comprises a fourth silicon carbide layer at least partially overlapping with the second silicon carbide layer along a direction normal to the silicon carbide substrate; the fourth silicon carbide layer, which has higher doping than the second silicon carbide layer, comprising a plurality of fourth portions that run substantially along a second direction perpendicular to the first direction; the first and second directions each being parallel to the silicon carbide substrate;
    wherein the first dopant type is N and the second dopant type is P: the third silicon carbide layer being a N+ layer, and the third portions of the third silicon carbide layer being separated from each other along the second direction; the fourth silicon carbide layer being a P+ layer, and the fourth portions are P+ portions which are separated from each other along the first direction; and
    wherein the second silicon carbide layer comprises a plurality of P-well regions separated from each other along the second direction.

2. The silicon carbide MOSFET device according to claim 1, wherein a depth of the fourth silicon carbide layer is equal to or smaller than a depth of the second silicon carbide layer.

3. The silicon carbide MOSFET device according to claim 2, wherein a spacing between the fourth portions of the fourth silicon carbide layer is equal to or smaller than a spacing of the P-well regions of the second silicon carbide layer.

4. The silicon carbide MOSFET device according to claim 1, wherein a depth of the fourth silicon carbide layer is greater than a depth of the second silicon carbide layer.

5. The silicon carbide MOSFET device according to claim 4, wherein a spacing between the fourth portions of the fourth silicon carbide layer is greater than a spacing of the P-well regions of the second silicon carbide layer.

6. The silicon carbide MOSFET device according to claim 1, wherein the plurality of P-wells is doped using multiple consecutive ion implantations with gradually lower energy and lower dose.

7. The silicon carbide MOSFET device according to claim 1, wherein the second silicon carbide layer comprises a P-base; the device further comprising a plurality of trenches.

8. The silicon carbide MOSFET device according to claim 7, wherein a depth of the fourth silicon carbide layer is greater than a depth of the plurality of trenches.

9. The silicon carbide MOSFET device according to claim 7, wherein the third silicon carbide layer comprises a P+ region sandwiched between two N+ regions on each of two opposite sides of the gate oxide layer.

10. The silicon carbide MOSFET device according to claim 7, wherein the third silicon carbide layer comprises two N+ regions without P+ region on each of two opposite sides of the gate oxide layer.

11. The silicon carbide MOSFET device according to claim 7, wherein the gate oxide layer comprises a plurality of oxide portions each formed along the sidewall direction in one of the plurality of trenches.

12. The silicon carbide MOSFET device according to claim 1, wherein a width of the fourth silicon carbide layer along the first direction is a minimum width that a fabrication process of the device can achieve.

13. The silicon carbide MOSFET device according to claim 1, wherein each of the fourth portions is in a strip, bamboo, I-beam or dumbbell shape when viewed from a direction perpendicular to the silicon carbide substrate.

14. The silicon carbide MOSFET device according to claim 1, wherein the third silicon carbide layer comprises two N+ regions as the third portions which are disposed respectively on two opposite sides of the gate oxide layer.

15. The silicon carbide MOSFET device according to claim 1, wherein the P+ portions are doped using multiple consecutive ion implantations with a double-peak profile.

16. A silicon carbide MOSFET device, comprising:
   a) a silicon carbide substrate of a first dopant type;
   b) a first silicon carbide layer of the first dopant type on top of the silicon carbide substrate, the first silicon carbide layer having lower doping than the silicon carbide substrate and defining a drift region;
   c) a second silicon carbide layer of a second dopant type embedded in a top portion of the first silicon carbide layer; the second silicon carbide layer comprising a plurality of second portions that run substantially along a first direction;
   d) a third silicon carbide layer of the first dopant type embedded in a top portion of the second silicon carbide layer; the third silicon carbide layer having higher doping than the first silicon carbide layer; the third silicon carbide layer comprising a plurality of third portions that run substantially along the first direction; and
   e) a gate oxide layer overlapped to the first silicon carbide layer, the second silicon carbide layer and the third silicon carbide layer; and in touch with a polysilicon layer;
   wherein, the device further comprises a fourth silicon carbide layer at least partially overlapping with the second silicon carbide layer along a direction normal to the silicon carbide substrate; the fourth silicon carbide layer, which has higher doping than the second silicon carbide layer, comprising a plurality of fourth portions that run substantially along a second direction perpendicular to the first direction; the first and second directions each being parallel to the silicon carbide substrate;
   wherein the first dopant type is N and the second dopant type is P: the third silicon carbide layer being a N+ layer, and the third portions of the third silicon carbide layer being separated from each other along the second direction; the fourth silicon carbide layer being a P+ layer, and the fourth portions are P+ portions which are separated from each other along the first direction; and
   wherein the third silicon carbide layer comprises two N+ regions as the third portions which are disposed respectively on two opposite sides of the gate oxide layer.

17. The silicon carbide MOSFET device according to claim 16, wherein the second silicon carbide layer comprises a P-base; the device further comprising a plurality of trenches.

18. A silicon carbide MOSFET device, comprising:
   a) a silicon carbide substrate of a first dopant type;
   b) a first silicon carbide layer of the first dopant type on top of the silicon carbide substrate, the first silicon carbide layer having lower doping than the silicon carbide substrate and defining a drift region;
   c) a second silicon carbide layer of a second dopant type embedded in a top portion of the first silicon carbide layer; the second silicon carbide layer comprising a plurality of second portions that run substantially along a first direction;
   d) a third silicon carbide layer of the first dopant type embedded in a top portion of the second silicon carbide layer; the third silicon carbide layer having higher doping than the first silicon carbide layer; the third silicon carbide layer comprising a plurality of third portions that run substantially along the first direction; and
   e) a gate oxide layer overlapped to the first silicon carbide layer, the second silicon carbide layer and the third silicon carbide layer; and in touch with a polysilicon layer;
   wherein, the device further comprises a fourth silicon carbide layer at least partially overlapping with the second silicon carbide layer along a direction normal to the silicon carbide substrate; the fourth silicon carbide layer, which has higher doping than the second silicon carbide layer, comprising a plurality of fourth portions that run substantially along a second direction perpendicular to the first direction; the first and second directions each being parallel to the silicon carbide substrate;
   wherein the first dopant type is N and the second dopant type is P: the third silicon carbide layer being a N+ layer, and the third portions of the third silicon carbide layer being separated from each other along the second direction; the fourth silicon carbide layer being a P+ layer, and the fourth portions are P+ portions which are separated from each other along the first direction; and
   wherein the P+ portions are doped using multiple consecutive ion implantations with a double-peak profile.

19. A method of producing a silicon carbide MOSFET device, comprising the steps of:
   a) providing a first silicon carbide layer of a first dopant type on top of a silicon carbide substrate; the first silicon carbide layer comprises first epitaxy layer and second epitaxy layer, which have same or different doping but both have lower doping than the silicon carbide substrate;
   b) providing a second silicon carbide layer of a second dopant type embedded in a top portion of the first silicon carbide layer;
   c) providing a third silicon carbide layer of the first dopant type embedded in a top portion of the second silicon carbide layer; the third silicon carbide layer having higher doping than the first silicon carbide layer; the third silicon carbide layer comprising a plurality of third portions that run substantially along a first direction;
   d) providing a gate oxide layer overlapped to the first silicon carbide layer, the second silicon carbide layer and the third silicon carbide layer; and in touch with a polysilicon layer; and
   e) providing a fourth silicon carbide layer at least partially overlapping with the second silicon carbide layer along a direction normal to the silicon carbide substrate; the fourth silicon carbide layer, which has higher doping than the second silicon carbide layer, comprises a plurality of fourth portions that run substantially along a second direction perpendicular to the first direction; the first and second directions each being parallel to the silicon carbide substrate;
   wherein the first dopant type is N and the second dopant type is P: the third silicon carbide layer being a N+ layer, and the third portions of the third silicon carbide layer being separated from each other along the second direction; the fourth silicon carbide layer being a P+ layer, and the fourth portions are P+ portions which are separated from each other along the first direction; and
   wherein the second silicon carbide layer comprises a plurality of P-well regions separated from each other along the second direction.

20. The method according to claim 19, further comprises the steps of:

f) multiple consecutive ion implantations of first series of dopants on a first epitaxy layer to make the lower P+ portions;
g) multiple consecutive ion implantations of second series of dopants on a second epitaxy layer, which is deposited on top of the first epitaxy layer, to make the upper P+ portions;
wherein the second series of dopants join the first series of dopants along a depth direction of the fourth silicon carbide layer, and result in double-peak profile.

* * * * *